(12) United States Patent
Matsuzawa et al.

(10) Patent No.: US 10,326,957 B2
(45) Date of Patent: *Jun. 18, 2019

(54) A/D CONVERTER AND SENSOR DEVICE USING THE SAME

(71) Applicant: TECH IDEA CO., LTD., Kawasaki-shi, Kanagawa (JP)

(72) Inventors: Akira Matsuzawa, Kawasaki (JP); Masaya Nohara, Tsukuba (JP)

(73) Assignee: TECH IDEA CO., LTD., Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,977

(22) Filed: Dec. 5, 2017

(65) Prior Publication Data

US 2018/0160066 A1    Jun. 7, 2018

(30) Foreign Application Priority Data

Dec. 5, 2016   (JP) .................................. 2016-235813
Mar. 15, 2017  (JP) .................................. 2017-050483
Nov. 13, 2017  (JP) .................................. 2017-218559

(51) Int. Cl.
*H04N 5/378*   (2011.01)
*H04N 5/363*   (2011.01)
*H03M 1/46*    (2006.01)
*H03M 1/38*    (2006.01)
*H03M 1/14*    (2006.01)
*H03M 1/06*    (2006.01)
*H03M 3/00*    (2006.01)

(52) U.S. Cl.
CPC .............. *H04N 5/378* (2013.01); *H03M 1/14* (2013.01); *H03M 1/38* (2013.01); *H04N 5/363* (2013.01); *H03M 1/069* (2013.01); *H03M 1/468* (2013.01); *H03M 3/43* (2013.01); *H03M 3/45* (2013.01); *H03M 3/458* (2013.01); *H03M 3/46* (2013.01)

(58) Field of Classification Search
CPC ................................. H03M 3/46; H03M 1/38
See application file for complete search history.

(56) References Cited

U.S. PATENT DOCUMENTS

| | | | | |
|---|---|---|---|---|
| 5,479,169 A | * | 12/1995 | Stryjewski | H03M 1/145 341/156 |
| 5,945,935 A | * | 8/1999 | Kusumoto | H03M 1/206 341/159 |
| 6,288,664 B1 | * | 9/2001 | Swanson | H03M 1/185 341/139 |

(Continued)

FOREIGN PATENT DOCUMENTS

JP    2005-323331 A    11/2005

*Primary Examiner* — Paulos M Natnael
(74) *Attorney, Agent, or Firm* — Hauptman Ham, LLP

(57) ABSTRACT

An A/D converter includes an analog input terminal, a successive approximation A/D converter connected to the analog input terminal, the successive approximation A/D converter for generating an upper conversion result at an upper conversion result terminal, the successive approximation A/D converter having an internal D/A converter generating an internal reference voltage at an internal reference voltage terminal, and a delta-sigma A/D converter connected to the analog input terminal and the internal reference voltage terminal, the delta-sigma A/D converter for generating a lower conversion result at a lower conversion result terminal.

26 Claims, 26 Drawing Sheets

(56) References Cited

U.S. PATENT DOCUMENTS

| | | | | |
|---|---|---|---|---|
| 6,414,619 B1* | 7/2002 | Swanson | H03M 1/185 | 341/139 |
| 6,448,912 B1* | 9/2002 | Berezin | H03M 1/20 | 341/131 |
| 6,590,517 B1* | 7/2003 | Swanson | H03M 1/185 | 341/139 |
| 6,611,222 B1* | 8/2003 | Murphy | H03M 1/168 | 341/120 |
| 6,639,526 B1* | 10/2003 | Mayes | H03M 3/498 | 341/143 |
| 7,479,914 B2* | 1/2009 | Kuramochi | C07K 1/22 | 341/155 |
| 7,495,589 B1* | 2/2009 | Trifonov | H03M 1/1019 | 341/118 |
| 7,605,738 B2* | 10/2009 | Kuramochi | H03M 1/0643 | 341/155 |
| 9,825,646 B1* | 11/2017 | Matsuzawa | H03M 3/458 | |
| 10,033,400 B1* | 7/2018 | Mallett | H03M 3/378 | |
| 10,077,472 B2* | 9/2018 | Fife | C12Q 1/6874 | |
| 2002/0163981 A1* | 11/2002 | Troemel, Jr. | H03D 3/007 | 375/345 |
| 2005/0206548 A1 | 9/2005 | Muramatsu et al. | | |
| 2008/0109179 A1* | 5/2008 | Tamba | G01R 19/2509 | 702/75 |
| 2009/0261998 A1* | 10/2009 | Chae | H03M 3/46 | 341/118 |
| 2011/0012519 A1* | 1/2011 | Zhao | H03M 1/1235 | 315/185 R |
| 2012/0133534 A1* | 5/2012 | Oshima | H03M 1/1052 | 341/110 |
| 2012/0313802 A1* | 12/2012 | Vigoda | H03M 1/20 | 341/155 |
| 2013/0038481 A1* | 2/2013 | Pedersen | H03M 1/0604 | 341/131 |
| 2014/0300501 A1* | 10/2014 | Ling | H03M 1/12 | 341/144 |
| 2016/0182075 A1* | 6/2016 | Devarajan | H03M 1/1019 | 341/120 |
| 2016/0360138 A1* | 12/2016 | Meynants | H01L 27/14609 | |
| 2017/0077940 A1* | 3/2017 | Yoshioka | H03M 1/1245 | |

* cited by examiner

FIG. 16A

| | SDR ADC | ΔΣADC | | | |
|---|---|---|---|---|---|
| | 10bit | 11bit | 12bit | 13bit | 14bit |
| Vs≧V1 | | | | | |
| V1>Vs≧V2 | | | | | |
| V2>Vs≧V3 | | | | | |
| V3>Vs≧V4 | | | | | |
| V4>Vs≧V5 | | | | | |

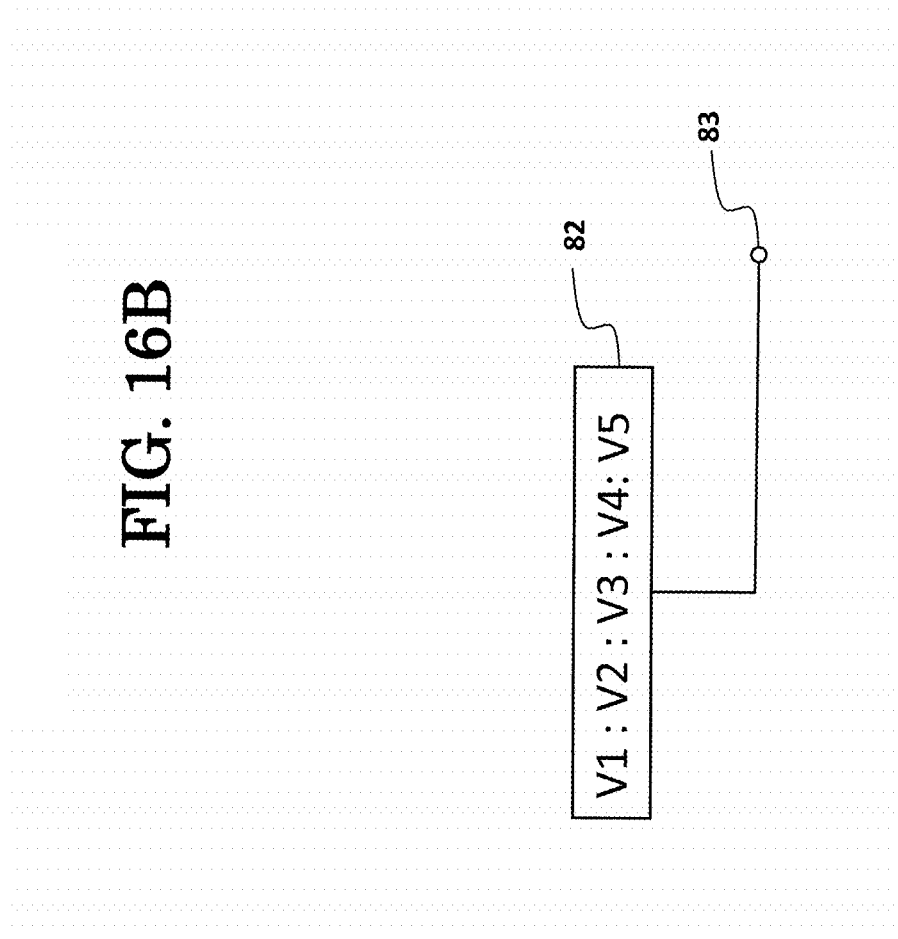

A/D CONVERTER AND SENSOR DEVICE USING THE SAME

CROSS-REFERENCE TO RELATED APPLICATIONS

This application is based upon and claims the benefit of priority from the prior Japanese Patent Application No. 2016-235813, filed on Dec. 5, 2016 and the prior Japanese Patent Application No. 2017-050483, filed on Mar. 15, 2017, and the prior Japanese Patent Application No. 2017-218559, filed on Nov. 13, 2017, the entire contents of which are incorporated herein by reference.

FIELD

The present invention relates to an A/D converter and a sensor device using the same. More specifically, the present invention relates to an A/D converter configured of a successive approximation A/D converter and a delta-sigma A/D converter connected in series thereto. Furthermore, the present invention relates to a sensor device having the A/D converter capable of high accuracy, high speed, and low power consumption.

BACKGROUND (A Conventional Sensor Device)

FIG. 22 shows a conventional sensor device 100. The sensor device 100 has a sensor region 110 with unit sensors 111 arranged in a matrix with rows and columns which detect a signal in the nature (sensed signal) and convert this signal into an electric signal. The unit sensors 111 are connected to row selection lines 112 and column selection lines 113. A vertical (row) operation circuit 130 supplies a predetermined voltage to one of the row selection lines 112 to select a row of the sensor region 110. The column selection lines 113 are connected to an A/D converting unit 120. The A/D converting unit 120 includes an A/D converter column 122 configured with a plurality of A/D converters arranged in columns. Furthermore, as required, a subtraction amplifier circuit 121 may be inserted between the column selection lines 113 and the A/D converter columns 122. An A/D horizontal (column) operation circuit 150 sequentially selects each column output of the A/D converter columns 122 for transfer to a data output terminal 151 for output. In synchronization with a clock signal supplied to a clock input terminal 141 from a clock supply circuit (not shown), a timing control circuit 140 generates a pulse signal for controlling each of the vertical (row) operation circuit 130 and the horizontal (column) operation circuit 150.

In synchronization with the clock input, a pulse signal is generated at the timing control circuit 140. With a row control signal generated at the vertical (row) operation circuit 130 in synchronization with the pulse signal, one row selection line 112 is activated, and an electric signal of the unit sensor 111 on the target row is taken out to the column selection line 113. Each column signal line is subjected to A/D conversion at the A/D converting unit 120. The A/D converting unit 120 may take a structure in which the subtraction amplifier circuit 121 and the A/D converter column 122 with unit A/D converters arranged in columns. An output signal from the A/D converting unit 120 is taken out from the data output terminal 151 with a control signal generated at the horizontal (column) operation circuit 150.

(An Universal Sensor Read Circuit)

The sensor requires a read circuit 160. FIG. 23 shows an universal sensor read circuit 160. A signal from the sensor is represented as a voltage source or current source. For example, a resistive pressure sensor using a resistance change by pressure or the like can detect a change in pressure as a change in voltage occurring at a resistor by letting current flow through resistor body. Also, a capacitive pressure sensor using a capacitance change by pressure or the like can detect a change in pressure as a change in the amount of charge by a capacitor. The change in the amount of charge can be detected as a change in voltage by using a certain capacitor.

The universal sensor read circuit 160 of FIG. 23 has a sensor 161 (represented as a voltage source) connected to a power supply voltage $V_{DD}$ and one end of a transistor $M_1$. A signal S/H (sample/hold) is supplied to the gate of the transistor $M_1$. A holding capacitor 162 is connected to the other end of the transistor $M_1$. A transistor $M_4$ is connected between the power supply voltage $V_{DD}$ and the holding capacitor 162. A signal RST is supplied to the gate of the transistor $M_4$. The holding capacitor 162 is further connected to the gate of a transistor $M_2$. One end of the transistor $M_2$ is connected to the power supply voltage $V_{DD}$, and the other end thereof is connected to one end of a transistor $M_3$. A signal SEL is supplied to the gate of the transistor $M_3$, and the other end is connected to a column current source 163. A read voltage $V_R$ appears at the other end of the transistor $M_3$.

In FIG. 23, by controlling the gate of the transistor $M_1$ with the signal S/H (sample/hold), the voltage $V_S$ of the sensor 161 is sampled and held in the holding capacitor 162. This held voltage is buffered at the transistor $M_2$ forming a source follower, and the gate of the transistor $M_3$ forming a switch is controlled with the row control signal SEL, thereby allowing the voltage to be taken out to the column signal line. The column current source 163 is provided to give a bias current required for the operation of the transistor $M_2$ forming a source follower. In the circuits of FIG. 23, circuits other than the column current source 163 are included in each unit sensor 111 and are arranged in a matrix. On the other hand, the column current source 163 is connected to the column selection line 113 for each column.

In this read circuit 160, a gate-source voltage $V_{GS}$ of the transistor is varied due to variations of a threshold voltage $V_T$ of the transistor $M_2$ configuring a source follower, and thus the signal source voltage $V_S$ cannot be accurately read. Thus, generally, a reference voltage $V_{REF}$ is first sent from a reference voltage generation circuit (not shown), the voltage $V_S$ including the signal is sent next, and a difference between these two voltages is taken, thereby allowing accurate reading of the signal source voltage $V_S$. By using this correlated double sampling, variations of the gate-source voltage $V_{GS}$ can be cancelled. Also, influences of 1/f noise of the transistor can be suppressed. As a matter of course, it goes without saying that the voltage $V_S$ including the signal may be sent first and then the reference voltage $V_{REF}$ may be sent next.

(A Slope A/D Converter)

An output from the sensor read circuit 160 is converted from an analog signal to a digital signal at the A/D converting unit 120. FIG. 24 shows a slope A/D converter 170 often used in a CMOS image sensor as a typical sensor device, and FIG. 25 shows a relation between the input signal and reference voltage.

The slope A/D converter 170 includes a plurality of unit A/D converters 171 and a ramp wave generator 172 provided in common. Each of the plurality of unit A/D converters 171 includes a comparator 173 and a counter 174. A ramp wave signal line 177 and a clock signal line 176 are provided in common to the plurality of unit A/D converters 171. An output from the ramp wave generator 172 is supplied to the ramp wave signal line 177.

With a ramp wave control signal supplied from $V_{RT}$ to a ramp wave control signal input terminal 179 as a trigger, the ramp wave generator 172 generates a ramp wave 190 with its voltage falling in proportion to time. The counter 174 configuring the unit A/D converter 171 starts counting of clock pulses supplied to the clock signal line 176. The comparator 173 compares an input signal supplied to an input terminal 178 and a reference signal, which is a ramp wave 190 generated at the ramp wave generator 172. When the reference signal is lower than the input signal ($T_{in}$), the comparator 173 generates a flag and stops the counter 174. The counter value at that time represents the input signal voltage $V_{in}$, and thus this value is taken out at a conversion output terminal 180 as a conversion output, and the counter 174 is reset with a reset signal supplied to a reset terminal 181.

This slope A/D converter has a simple structure, a small differential non-linearity error, compensated monotonicity, and high robustness. Therefore, the slope A/D converter is widely used in a CMOS image sensor.

On the other hand, the slope A/D converter has also many problems. An example of the problems is a tradeoff between conversion speed and resolution. The time $T_{in}$ represents an input signal. Thus, when a time usable for conversion is $T_{FS}$, a clock frequency $f_{clk}$ in an A/D converter with a resolution of N bits is represented as follows.

$$f_{clk}=2^N/T_{FS} \quad (1)$$

It is assumed that the number of frames is $N_F$, the number of vertical pixels is $N_V$, reset read and signal read are performed, and a half of each cycle can be used for A/D conversion. In this case, the following equation holds.

$$T_{FS}=1/(4N_FN_V) \quad (2)$$

Thus, the following equation holds.

$$f_{clk}=2^{N+2}N_FN_V \quad (3)$$

When the number of frames is 100, the number of vertical pixels is 2000, and the usable clock frequency is on the order of 2 GHz at maximum, the resolution is on the order of 11 bits, which is on the order of 68 dB in terms of dynamic range.

The accuracy of the A/D converter is determined not only by the clock frequency, and the comparator is also a factor for determining the accuracy of the A/D converter. The noise voltage of the comparator is on the order of 150 μV to 200 μV, which is on the order of 75 dB in terms of dynamic range. Therefore, the dynamic range of the slope A/D converter is 70 dB at the best.

The number of electrons handled by the unit sensor is generally several tens of thousands. Thus, if it is assumed that the number of electrons is thirty thousand and the holding capacitor is 5 fF, the maximum output voltage is on the order of 1 V. The minimum value to a signal to be detected is one electron, and this is equivalent to 30 μV. Therefore, a necessary dynamic range is approximately 90 dB. In the slope A/D converter, it is difficult to achieve a high dynamic range that the pixel intrinsically has. Thus, in one sensor device, a higher dynamic range is tried to be acquired by performing correlated double sampling and, as described above, providing a subtraction amplifier with a gain on the order of 0 dB to 20 dB variable before A/D conversion. However, a large capacitor of 10 pF to 20 pF is often used to suppress noise and, as a result, not only an area increase but also an increase in power consumption is invited.

Therefore, the A/D converter currently used in the sensor device does not achieve a high dynamic range required for the sensor at high speed and with low power consumption. Also, the use of an amplifier causes stationary current to flow, thereby making it difficult to achieve functions required for IoT in the future, such as applicative variability of the read speed and intermittent operation (Japanese Unexamined Patent Application Publication No. 2005-323331).

SUMMARY

An A/D converter according to one aspect of the present invention includes an analog input terminal, a successive approximation A/D converter connected to the analog input terminal, the successive approximation A/D converter for generating an upper conversion result at an upper conversion result terminal, the successive approximation A/D converter having an internal D/A converter generating an internal reference voltage at an internal reference voltage terminal, and a delta-sigma A/D converter connected to the analog input terminal and the internal reference voltage terminal, the delta-sigma A/D converter for generating a lower conversion result at a lower conversion result terminal.

An A/D converter of another aspect of the present invention includes an analog input terminal, a differential amplifier having a pair of input signal ends and a pair of output signal ends, the differential amplifier for generating a differential voltage by amplifying a differential input voltage of the pair of input signal ends at the pair of output signal ends, a sampling capacitor connected between the analog input terminal and one of the input signal end, capacitive D/A convertors connected to the other input signal end, the capacitive D/A convertors for generating an internal reference voltage corresponding to the input value at the other input end, the capacitive D/A convertors for performing a successive approximation A/D conversion, a pair of switches, the pair of switches for clamping a voltage of the pair of input signal ends to a predetermined voltage, and a pair of capacitors connected to the pair of input signal ends, the pair of capacitors for performing a delta-sigma A/D conversion.

The above-described A/D converter is desired to further include a pair of capacitors, one terminal of which is connected to the pair of output signal ends, a comparator connected to another terminal of the pair of capacitors, the comparator for performing the successive approximation A/D conversion, an integrator connected to the another terminal of the pair of capacitors, the integrator for performing the delta-sigma A/D conversion, and a pair of switches, the pair of switches for clamping a input voltage of the comparator and the integrator to a predetermined voltage.

The above-described A/D converter is desired to further include a circuit for controlling an oversampling ratio of the delta-sigma A/D converter.

In the above-described A/D converter, the delta-sigma A/D converter is a second order delta-sigma A/D converter.

In the above-described A/D converter, a voltage range of the internal reference voltage is 1 LSB or more of the successive approximation A/D converter and 2 LSB or less of the successive approximation A/D converter.

In the above-described A/D converter, sampling and A/D conversion are performed a plurality of times to obtain one A/D conversion output.

The above-described A/D converter is desired to further include a controller for rendering the successive approximation A/D converter to provide the upper conversion result and then for rendering the delta-sigma A/D converter to provide the lower conversion result in response to the upper conversion result.

In the above-described A/D converter, the delta-sigma A/D converter has an integrator, the integrator includes a first switch one terminal of which is connected to an delta-sigma A/D converter input terminal, a first capacitor connected between a reference voltage terminal and another terminal of the first switch, a second switch connected between an delta-sigma A/D converter output terminal and the other terminal of the first switch, a second capacitor connected between the reference voltage terminal and the delta-sigma A/D converter output terminal, an amplifier having an input connected to the delta-sigma A/D converter output terminal and an output, the amplifier amplifying a voltage at the delta-sigma A/D converter output terminal, a third switch one terminal of which is connected to the output of the amplifier, a forth switch connected between the delta-sigma A/D converter output terminal and another terminal of the third switch, a third capacitor connected between the reference voltage terminal and the other terminal of the third switch, and a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

In the above-described A/D converter, the amplifier is a dynamic type amplifier.

In the above-described A/D converter, the amplifier includes first and second output capacitors, a pre-charge circuit connected to the first and the second output capacitors, the pre-charge circuit pre-charging the first and the second output capacitors; and a discharge circuit connected to the first and the second output capacitors, the discharge circuit selectively discharging one of the first and the second output capacitors in response to a voltage applied to the input of the amplifier.

The above-described A/D converter is desired to further include a circuit for controlling either one of (a) a usage of the delta-sigma A/D converter, (b) an oversampling ratio of the delta-sigma A/D converter, (c) a quantization voltage of the delta-sigma A/D converter, or (d) a conversion energy of the delta-sigma A/D converter.

In the above-described A/D converter, a noise $V_{n\_ad}$ of the A/D converter is smaller than a shot noise $V_{n\_sh}$ of the sensor The above-described A/D converter is desired to further include a data storage for storing a value corresponding to (a) the usage of the delta-sigma A/D converter or (b) the oversampling ratio of the delta-sigma A/D converter, (c) the quantization voltage of the delta-sigma A/D converter, or (d) the conversion energyof the delta-sigma A/D converter.

The above-described A/D converter is desired to further include a controller for rendering the successive approximation A/D converter and the delta-sigma A/D converter to alternately convert a reference signal and a signal from a signal source, wherein the controller controls the internal D/A converter to be supply with a conversion result of a past reference signal for generating the internal reference voltage.

The above-described A/D converter is desired to further include a controller for rendering the successive approximation A/D converter and the delta-sigma A/D converter to alternately convert a reference signal and a signal from a signal source, wherein the controller controls the internal D/A converter to be supply with a conversion result of a past signal from the signal source for generating the internal reference voltage.

In the above-described A/D converter, when the conversion result of the past signal from the signal source is smaller than a reference value the controller controls the internal D/A converter to be supply a conversion result of a past reference signal for generating the internal reference voltage.

A sensor device of still another aspect of the present invention includes, a sensor detecting a signal in the nature and converting the signal into an electric signal, and an A/D converter using the electric signal as an input voltage, wherein the A/D converter includes an analog input terminal, a successive approximation A/D converter connected to the analog input terminal, the successive approximation A/D converter for generating an upper conversion result at an upper conversion result terminal, the successive approximation A/D converter having an internal D/A converter generating an internal reference voltage at an internal reference voltage terminal; and a delta-sigma A/D converter connected to the analog input terminal and the internal reference voltage terminal, the delta-sigma A/D converter for generating a lower conversion result at a lower conversion result terminal.

In the above-described sensor device, the sensor comprises a plurality of unit sensors and an operation circuit for selecting the unit sensor.

In the above-described sensor device, the sensor further includes a signal source for detecting the signal in the nature, a reference signal source for supplying a reference signal, and a transistor for transferring these signals to a holding capacitor.

BRIEF DESCRIPTION OF DRAWINGS

FIG. 16A is a table for describing operation of an A/D converter according to the other embodiment of the present invention;

FIG. 16B is a diagram of a storage region included in the A/D converter according to the other embodiment of the present invention;

DESCRIPTION OF EMBODIMENTS (A Sensor Device and A/D Converter Using Therefor)

Figure 1:
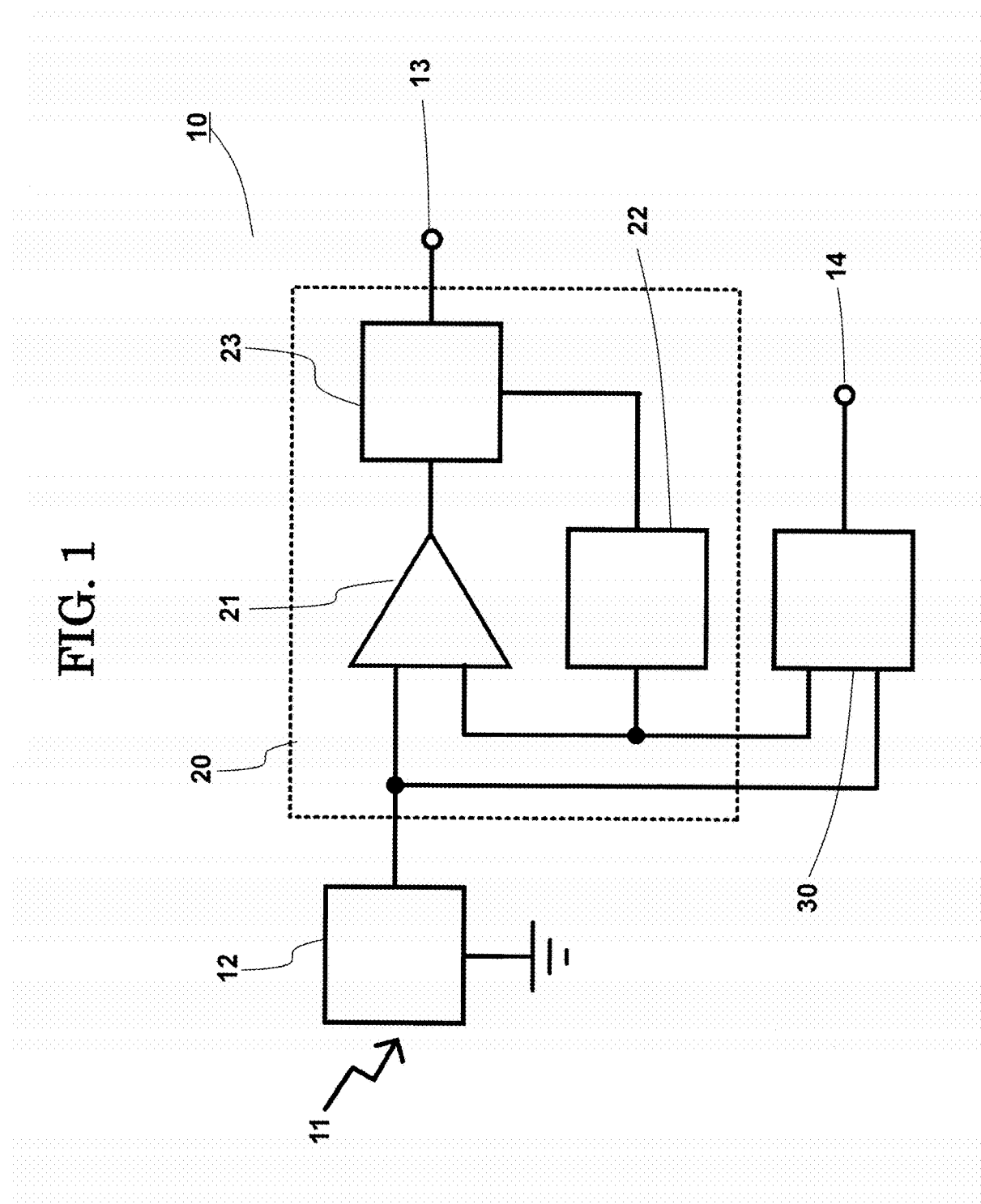
FIG. 1 is a circuit diagram of a sensor device according to one embodiment of the present invention.

FIG. 1 shows a sensor device 10 according to one embodiment of the present invention. The sensor device 10 includes a sensor 12 receiving a signal 11 in the nature, a successive approximation A/D converter 20, and a delta-sigma A/D converter 30. The successive approximation A/D converter 20 includes a comparator 21, an internal D/A converter 22, and a control logic circuit 23.

The signal 11 in the nature is converted at the sensor 12 into an electric signal $V_{IN}$, which is supplied to the successive approximation A/D converter 20 for successive conversion, and an upper conversion value $D_U$ is supplied to an upper conversion value terminal 13. Next, a differential voltage between the electric signal $V_{IN}$ from the sensor 12 and an internal reference voltage $V_{INTREFDL}$ generated by the internal D/A converter 22 is supplied to the delta-sigma A/D converter 30 for A/D conversion. A conversion value from the successive approximation A/D converter 20 is taken as the upper A/D conversion value $D_U$, and a conversion value from the delta-sigma A/D converter 30 is taken as a lower conversion value $D_L$, which is supplied to a lower conversion value terminal 14. The upper conversion value $D_U$ and the lower conversion value $D_L$ are combined together to acquire an entire A/D conversion value $[D_U D_L]$.

(A Successive Conversion Step)

Figure 2:
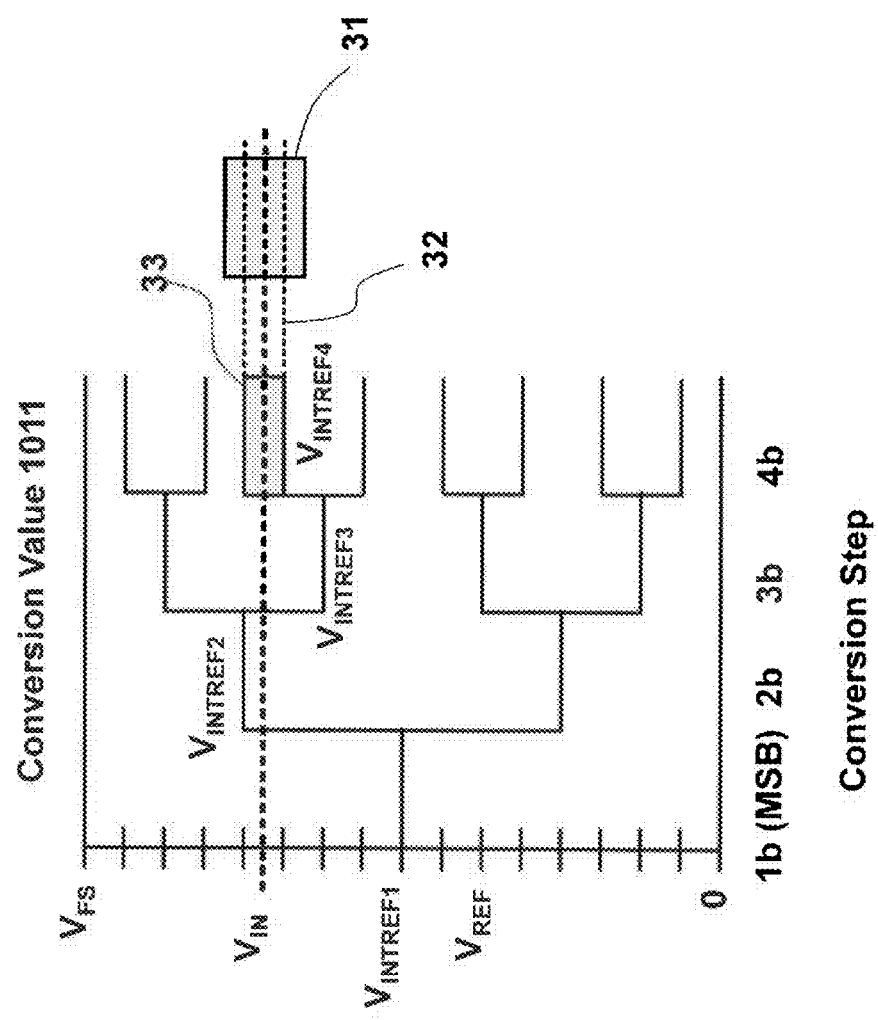
FIG. 2 is a diagram for describing operation of a successive A/D converter according to one embodiment of the present invention.

FIG. 2 shows the state of the input voltage $V_{IN}$ as a sensor output and internal reference voltages $V_{INTREF1}$ to $V_{INTREF4}$ for each conversion step of the successive approximation A/D converter 20. By way of example, the resolution of the successive approximation A/D converter 20 is assumed to be four bits. In addition, the input voltage is assumed to be 11.5/16 with respect to a full-scale voltage $V_{FS}$.

In the conversion step for the first bit, the internal D/A converter 22 outputs a half of the full-scale voltage $V_{FS}$ as the internal reference voltage $V_{INTREF1}$. This internal reference voltage $V_{INTREF1}$ and an input voltage $V_{IN}$ are compared with each other. In this example, as the input voltage $V_{IN}$ is higher than the $V_{INTREF1}$, the successive approximation A/D converter 20 outputs 1. In conversion for the next second bit, based on the conversion result for the first bit, the internal D/A converter 22 outputs three quarters of the full-scale voltage $V_{FS}$ as the internal reference voltage $V_{INTREF2}$. In this case, as the input voltage $V_{IN}$ is lower than the $V_{INTREF2}$, the successive approximation A/D converter 20 outputs 0. In conversion for the next third bit, based on the conversion result for the second bit, the internal D/A converter 22 outputs five eighths of the full-scale voltage $V_{FS}$ as the internal reference voltage $V_{INTREF3}$. In this case, as the input voltage $V_{IN}$ is higher than the $V_{INTREF3}$, the successive approximation A/D converter 20 outputs 1. In conversion for the next fourth bit, based on the conversion result for the third bit, the internal D/A converter 22 outputs 11/16 of the full-scale voltage $V_{FS}$ as the internal reference voltage $V_{INTREF4}$. In this case, as the input voltage $V_{IN}$ is higher than the $V_{INTREF4}$, the successive approximation A/D converter 20 outputs 1. Therefore, the upper A/D conversion value $D_U$ is 1011.

(A Delta-sigma Conversion Step)

After successive approximation A/D conversion, the input voltage $V_{IN}$ supplied from the sensor 12 and the internal reference voltage $V_{INTREFDL}$ for lower A/D conversion generated at the internal D/A converter 22 are both supplied to the delta-sigma A/D converter 30. In this example, the input voltage $V_{IN}$ supplied from the sensor 12 is 11.5/16 of the full-scale voltage $V_{FS}$ and the internal reference voltage $V_{INTREF4}$ ($V_{INTREFDL}$) generated at the internal D/A converter 22 is 11/16 of the full-scale voltage $V_{FS}$, therefore a differential voltage is 0.5/16. The delta-sigma A/D converter 30 performs delta-sigma A/D conversion in a conversion range equivalent to 1 LSB of the successive approximation A/D converter 20 or a conversion range with an overlap on the order of 1 LSB added thereto, thereby acquiring the lower conversion value $D_L$. In FIG. 2, 32 denotes the internal reference voltage $V_{INTREFDL}$ generated at the internal D/A converter 22, 33 denotes a voltage range of 1 LSB of the successive approximation A/D converter 20, and 31 is a conversion range of the delta-sigma A/D converter 30.

Figure 3:
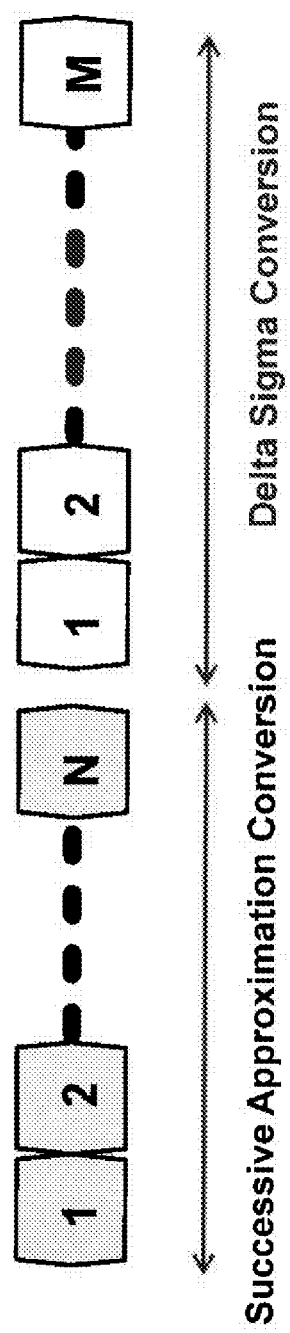
FIG. 3 is a diagram for describing operation of a conversion step of A/D conversion according to one embodiment of the present invention.

FIG. 3 is a diagram for describing operation of a conversion step of A/D conversion according to one embodiment of the present invention. First, N-bit successive approximation A/D conversion is performed, and then delta-sigma A/D conversion is performed successively M times.

(Operation and Effect of Present Embodiment)

By performing this A/D conversion as described above, a high dynamic range and high-speed A/D conversion can be simultaneously achieved. A dynamic range DR acquired is represented by the following equation.

$$DR(3\pi/2)(2^N-1)^2(2L+1)(M/\pi)^{2L+1} \qquad (4)$$

Here, L is an order of an integrator, and M is an oversampling count.

Figure 4:
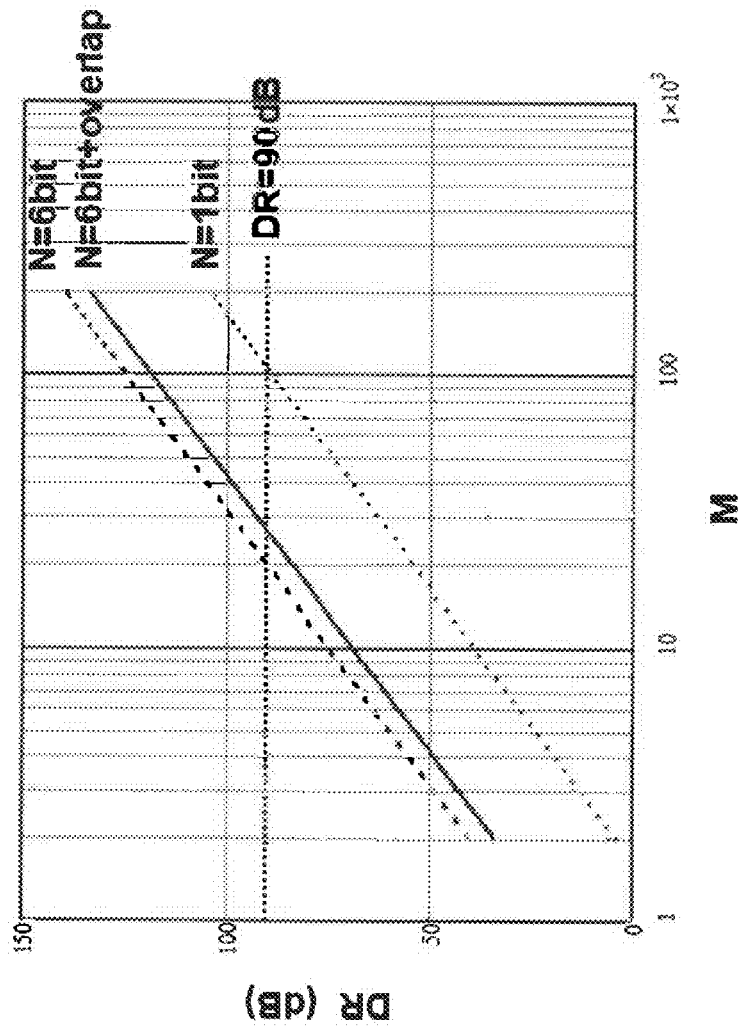
FIG. 4 is a graph showing a dynamic range of delta-sigma A/D conversion according to one embodiment of the present invention.

FIG. 4 shows a dynamic range acquired with respect to a conversion count M of delta-sigma A/D conversion, with a resolution N in a second order delta-sigma A/D converter taken as a parameter. When a target dynamic range is assumed to be 90 dB, M is 100 when only the delta-sigma A/D converter is used. However, in combination with the six-bit successive approximation A/D converter of the present invention, M=20 can be achieved. Even if an overlap of 1 LSB is provided, M=30 can be achieved. The conversion time of the successive A/D converter is extremely shorter than that of the delta-sigma A/D converter, and power consumption of the successive A/D converter is also extremely small. Thus, a conversion count ratio can be thought as representing a ratio between speed and power consumption. Therefore, in the present invention, by combining the successive A/D converter and the delta-sigma A/D converter, the conversion speed is improved three times to five times, and also power consumption can be reduced by one thirds to one fifths.

In addition, with the use of delta-sigma A/D conversion, low noise in a signal band of a comparator is sufficiently suppressed by the noise shaping effect, and thus does not inhibit achievement of a high dynamic range.

Furthermore, with the use of oversampling, kT/C noise of capacitors included in the circuit is decreased to λ times (λ<1).

$$\lambda = 1/M^{1/2} \quad (5)$$

For example, λ=0.22 when M=20, and X=0.18 when M=30. Thus, the capacitors required for acquiring the same dynamic range can be reduced by one fourths to one fifths.

In the specifications desired in the sensor device, a desired dynamic range may often vary. In this case, in the present embodiment, as represented in Equation (4), the oversampling ratio M of the delta-sigma A/D converter is changed, thereby easily changing the dynamic range to be achieved. To change the oversampling ratio M, it is required to set a conversion count, a word length of a decimation filter, and a number for standardizing the acquired A/D conversion value. The present embodiment includes setting means for this.

The delta-sigma A/D converter 30 uses a so-called incremental delta-sigma A/D converter which acquires an A/D conversion value with a finite conversion count. Regarding its order, it has been known that a second order delta-sigma A/D converter can achieve the highest dynamic range. Therefore, it is appropriate to use the second order delta-sigma A/D converter.

As can be seen from FIG. 2, the A/D conversion range of the delta-sigma A/D converter 30 requires at least a voltage range equivalent to 1 LSB of the successive approximation A/D converter 20. However, in actual conversion, due to voltage variation factors such as noise and voltage drift, an overlap voltage is required for widening the A/D conversion range of the delta-sigma A/D converter 30 more than 1 LSB of the successive approximation A/D converter 20. However, if this overlap voltage is too large, the quantization voltage of the delta-sigma A/D converter 30 is increased, and the dynamic range achievable at the same oversampling ratio M is decreased. Thus, an overlap voltage of 0.5 LSB on each of an upper side and a lower side is appropriate, also in consideration of system simplification. Therefore, the A/D conversion range of the delta-sigma A/D converter 30 is desirably 1 LSB or more of the successive approximation A/D converter 20 and 2 LSB or less of the successive approximation A/D converter 20.

In A/D conversion, signal sampling is required. Sampling, however, causes kT/C noise to occur, thereby decreasing the dynamic range of A/D conversion. Sampling M times increases the dynamic range in proportion to the square root of M, as represented in Equation (5). Thus, to increase the dynamic range, it is effective to perform signal sampling and A/D conversion a plurality of times.

Meanwhile, there is a method of performing A/D conversion by combining the successive approximation A/D converter and the delta-sigma A/D converter. In this method, after the input signal is sampled, successive approximation A/D conversion is performed. After the successive approximation A/D conversion, the delta-sigma A/D converter is operated at several clocks or so to acquire a conversion value, and the input signal is sampled at the next timing. Then, successive approximation A/D conversion is performed. After the successive approximation A/D conversion, the delta-sigma A/D converter is operated at several clocks or so to acquire a conversion value. The use of this method for A/D conversion is required when an input signal significantly varied with time. However, when temporal variation of the electric signal from the sensor is small or when the electric signal from the sensor has been already sampled, instead of using the above-described A/D conversion method, an A/D conversion method is used in which successive approximation A/D conversion is first performed and a differential voltage between this conversion value and the internal reference voltage generated by the internal D/A converter is supplied to the delta-sigma A/D converter a plurality of times for A/D conversion. With this method, a delta-sigma conversion count per unit time, that is, the oversampling count M, can be more increased, and thus a higher dynamic range can be acquired. Furthermore, unnecessary successive approximation is not required, and thus lower power consumption can be achieved.

However, when successive approximation A/D conversion is first performed and a differential voltage between this conversion value and the internal reference voltage generated by the internal D/A converter is supplied to the delta-sigma A/D converter for A/D conversion, performing a process as described below M times is more effective. That is, an electric signal from the sensor is sampled in synchronization with the operation clock of the delta-sigma A/D converter, and the internal D/A converter of the successive approximation A/D converter is operated to immediately generate and supply a differential voltage with respect to the internal reference voltage to the delta-sigma A/D converter for A/D conversion. This can more reduce kT/C noise occurring at the time of sampling, as represented in Equation (5).

(Correlated Double Sampling)

Figure 5:
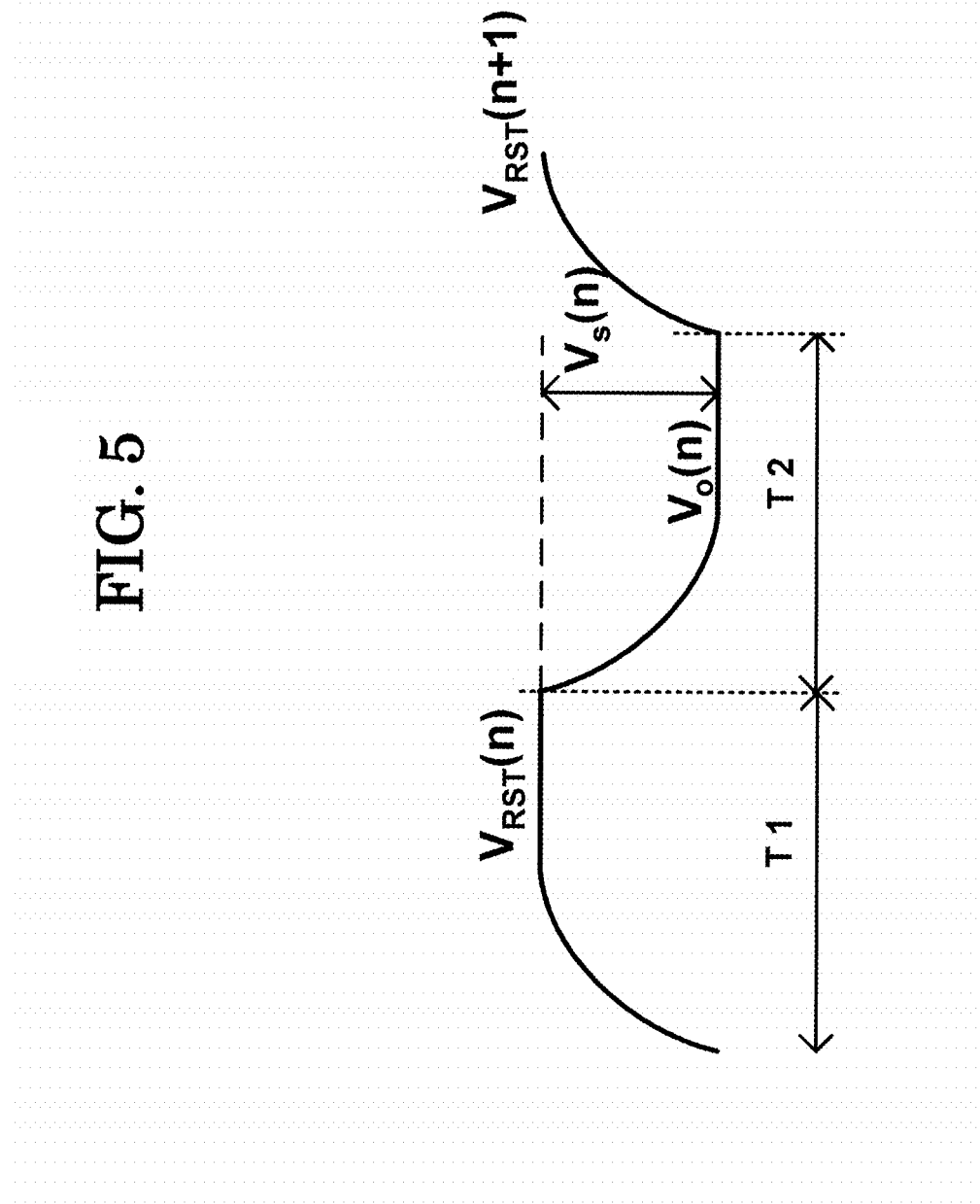
FIG. 5 is a diagram of correlated double sampling according to one embodiment of the present invention.

In the sensor device 10 of the present embodiment of the present invention, correlated double sampling can be used as shown in FIG. 5. That is, to inhibit an offset voltage and voltage drift of a signal transfer circuit, a reference signal is first sent, then a voltage including the signal is sent, and a difference therebetween is taken as a true signal voltage. This is generally performed at an analog subtractor, and a variable-gain amplifier on the order of 0 dB to 20 dB may be used. In the A/D converter of the present invention, however, since the dynamic range is high, a signal $V_{RST}(n)$ as a reference is subjected to A/D conversion at a timing T1, then a voltage $V_o(n)$ including the signal is subjected to A/D conversion at a timing T2, and a difference between their conversion values is taken to acquire a true signal voltage conversion value $V_s(n)$.

For this reason, it is not required to use an amplifier with a large area and large power consumption where a stationary current flows. Thus, the present invention is superior in both area and power consumption, and can easily achieve adaptive variability of the frame rate and intermittent operation.

In the above description, the reference signal is first sent, and then the voltage including the signal is sent. It goes without saying that, however, the structure may be such that the voltage including the signal is first sent and then the reference signal is sent. Therefore, the present invention is suitable for a sensor device requiring a high dynamic range.

(An Example in Which Present Invention is Applied to CMOS Image Sensor)

Figure 22:
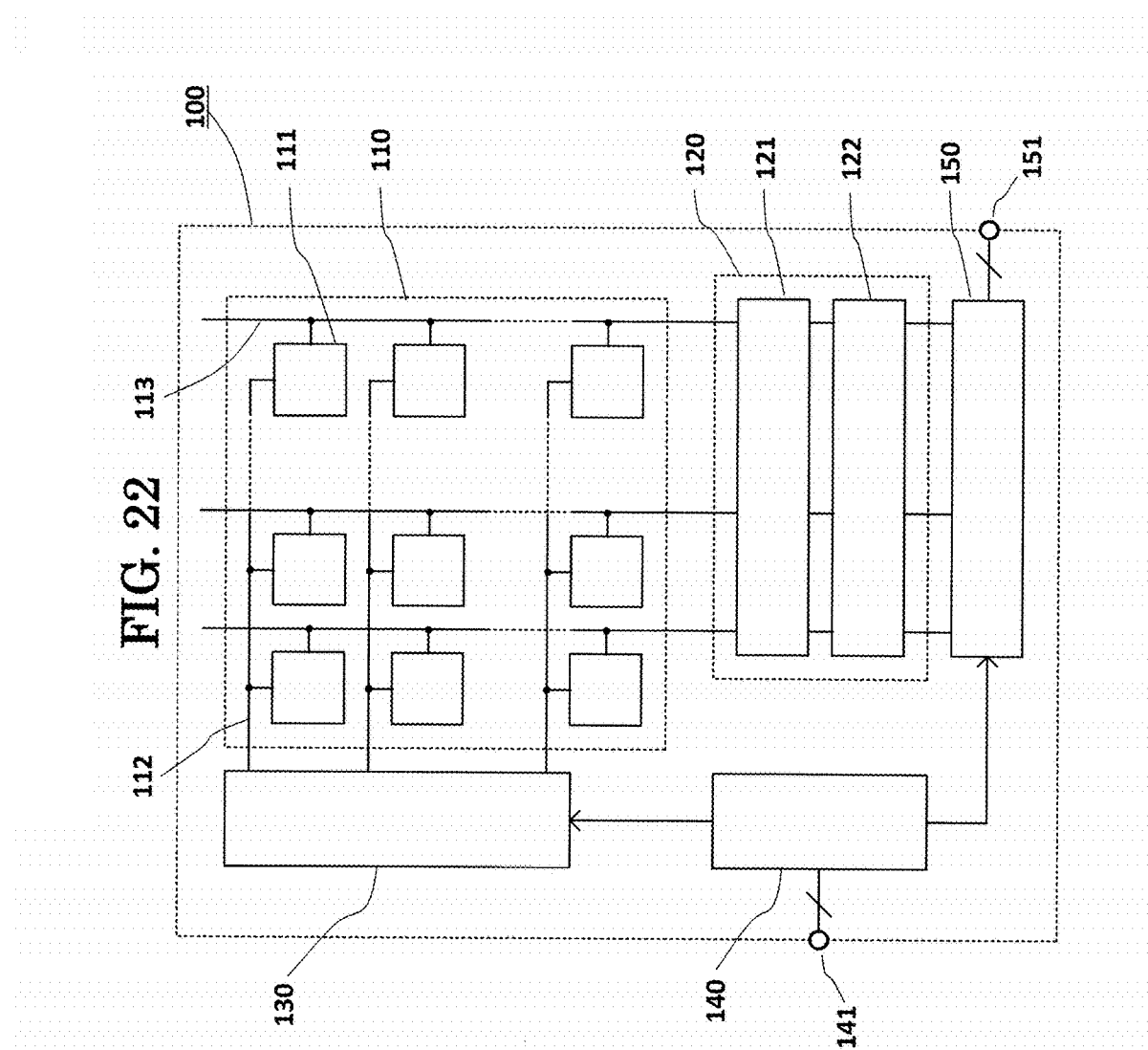
FIG. 22 is a circuit diagram of a conventional sensor device.
Figure 23:
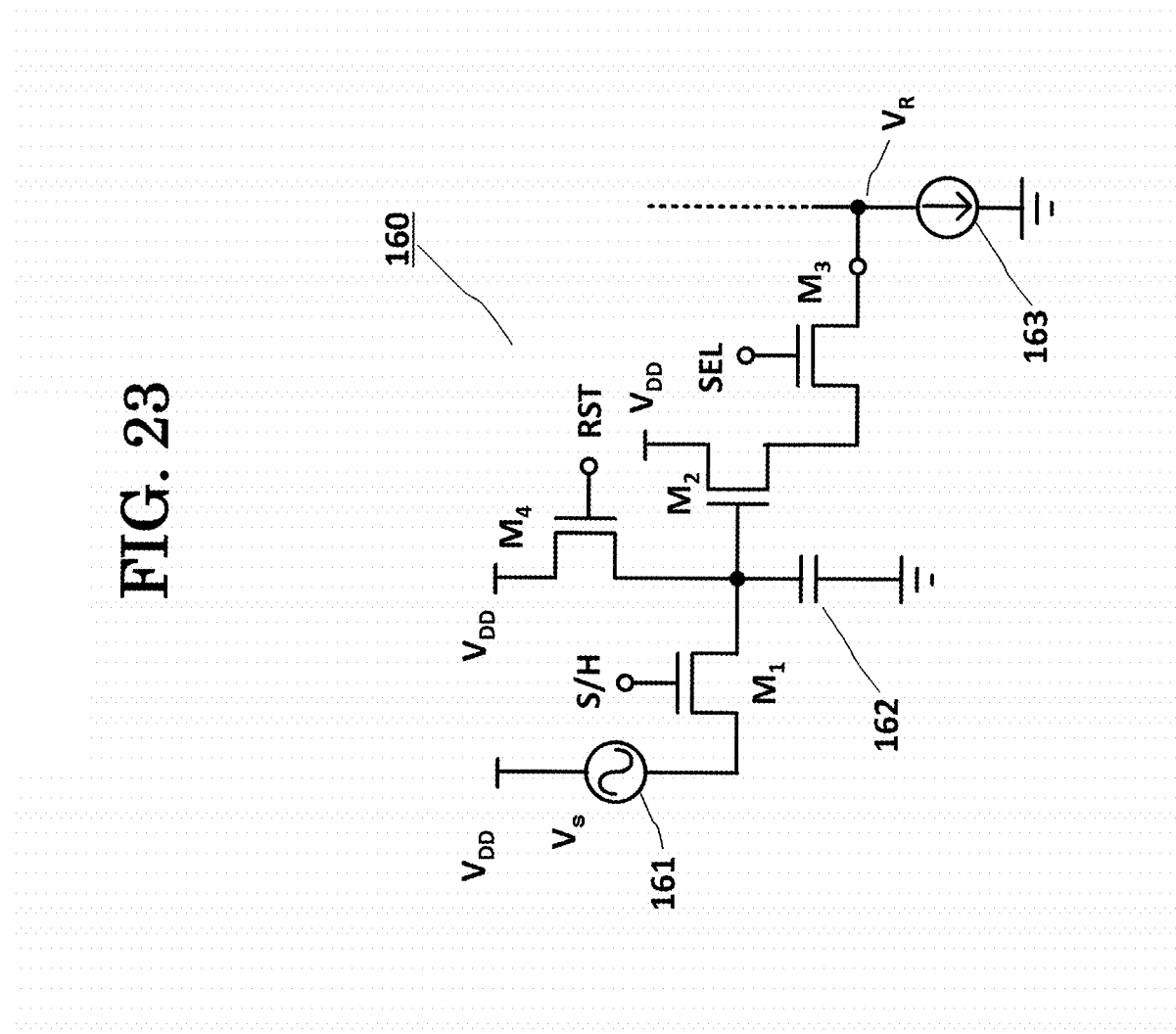
FIG. 23 is a circuit diagram of a unit sensor of the conventional sensor device.
Figure 24:
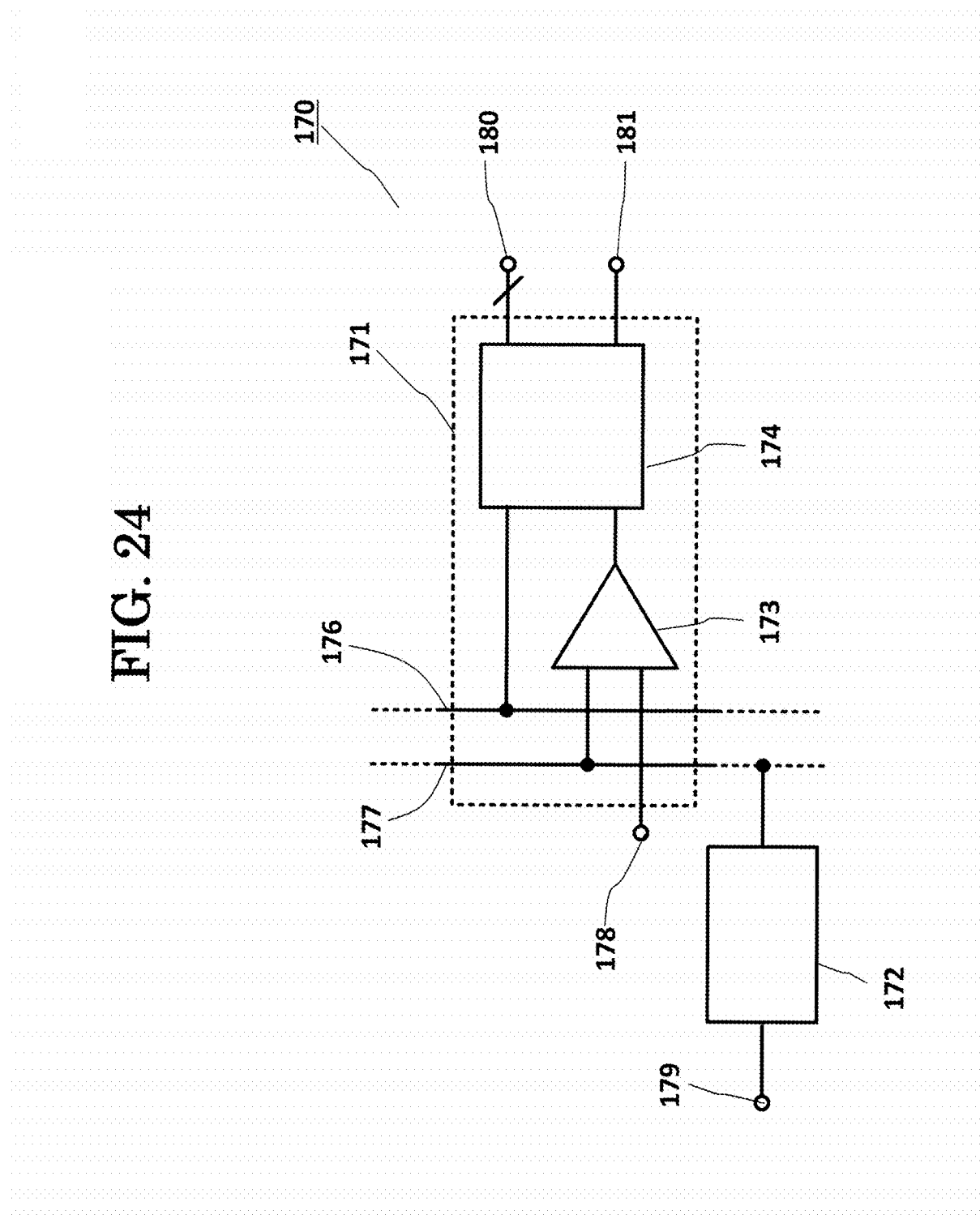
FIG. 24 is a circuit diagram of a slope A/D converter of the conventional sensor device.
Figure 25:
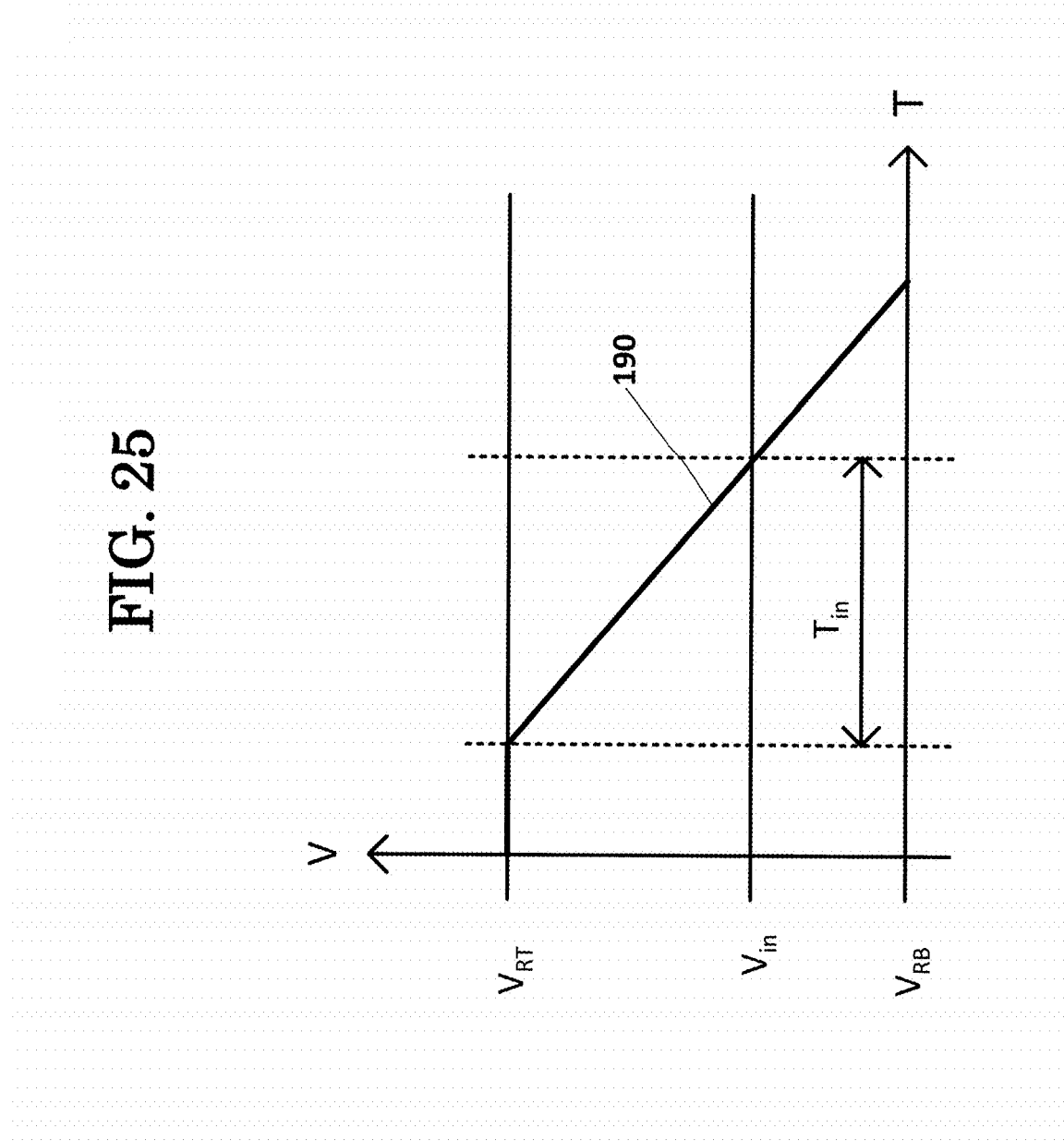
FIG. 25 is a graph showing operation of the slope A/D converter of the conventional sensor device.

By way of example, a CMOS image sensor is described. The structure of the CMOS image sensor is identical to the structure of the sensor device shown in FIG. 22, and individual A/D converters configuring the A/D converter column 122 correspond to the successive approximation A/D converter 20 and the delta-sigma A/D converter 30. In addition, the unit sensor has the same structure as that of the sensor device shown in FIG. 22, and this corresponds to the sensor 12 of FIG. 1. The above description of the universal sensor read circuit is also applied to the present embodiment.

Figure 6:
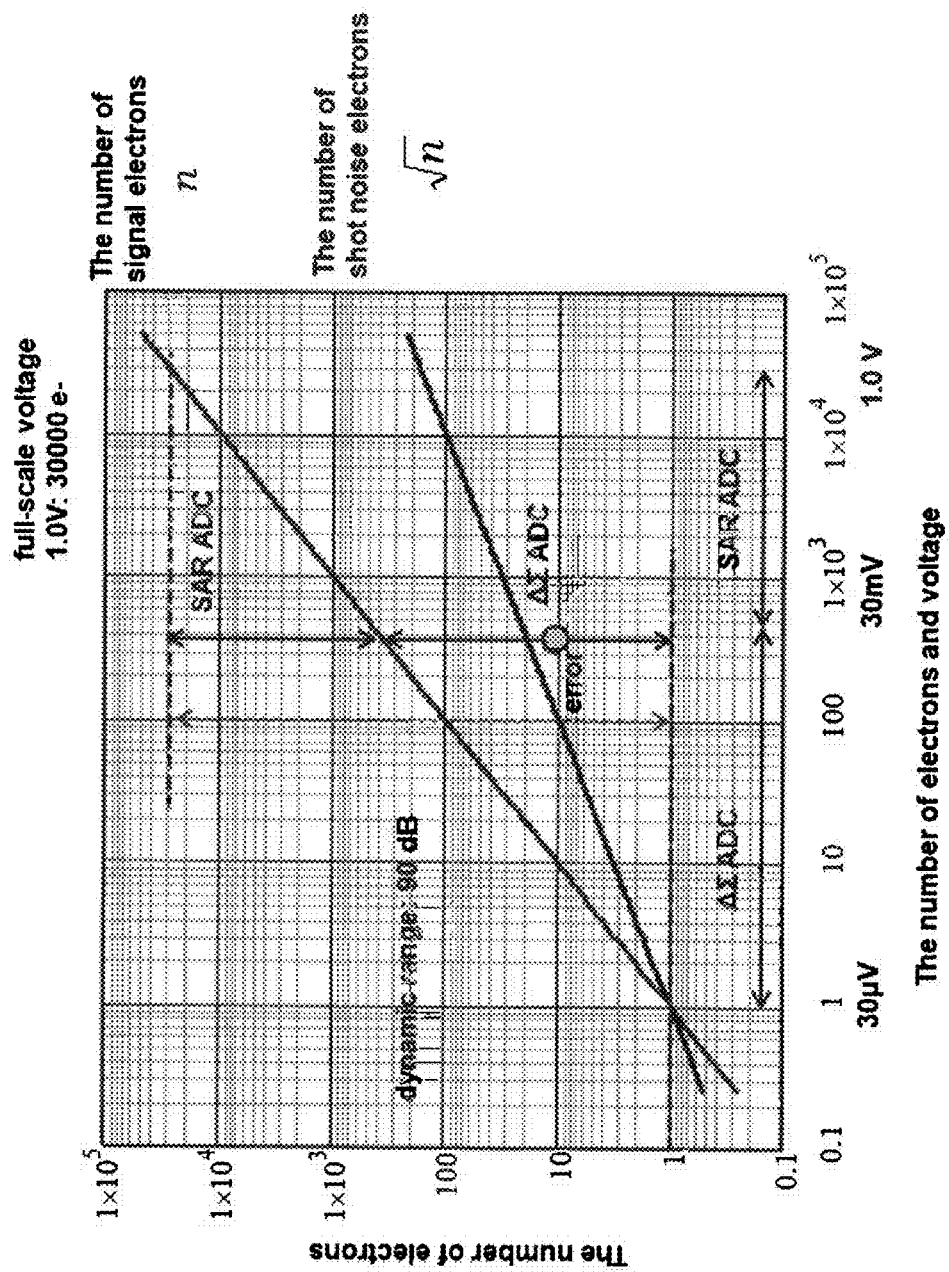
FIG. 6 is a graph showing a dynamic range of a CMOS image sensor according to one embodiment of the present invention.

FIG. 6 is a diagram of a signal dynamic range of the CMOS image sensor and shot noise as substantial noise. The number of signal electrons has a range from one to 30000. Therefore, the dynamic range is approximately 90 dB. The full-scale voltage is often set at 1 V, and thus a voltage per electron is 30 µV. The number of shot noise electrons $n_s$ has a relation with respect to the number of signal electrons n as follows.

$$n_s = n^{1/2} \tag{6}$$

In the sensor device of the present invention, A/D conversion is performed by the delta-sigma A/D converter in a voltage range of ±1 LSB of the successive A/D converter. Here, when the resolution of the successive A/D converter is assumed to be six bits and the full-scale voltage is assumed to be 1 V, 1 LSB is 16 my. In general, the delta-sigma A/D converter is used for A/D conversion at a signal voltage of 16 mV or smaller. However, it is known that a differential non-linearity error of the delta-sigma A/D converter is almost zero when a one-bit D/A converter is used. Therefore, favorable characteristics with less noise can be acquired at a dark level with weak light. When the signal voltage is 16 mV or higher, the successive A/D converter is used, and there is a possibility that a conversion error of the internal D/A converter in use is included. However, the differential non-linearity error of the internal D/A converter is generally on the order of 0.03%, and there is a possibility that a conversion error on the order of 300 µV is included. However, this error may be included in a switching voltage of 16 mV. Since the shot noise at this point is 600 µV, the error is hidden by the shot noise and is at a hardly detectable level. Therefore, the CMOS image sensor according to the present invention can achieve favorable imaging characteristics with less noise from extremely weak light to extremely strong light.

(An Integrator included in Delta-Sigma Converter)

Figure 7:
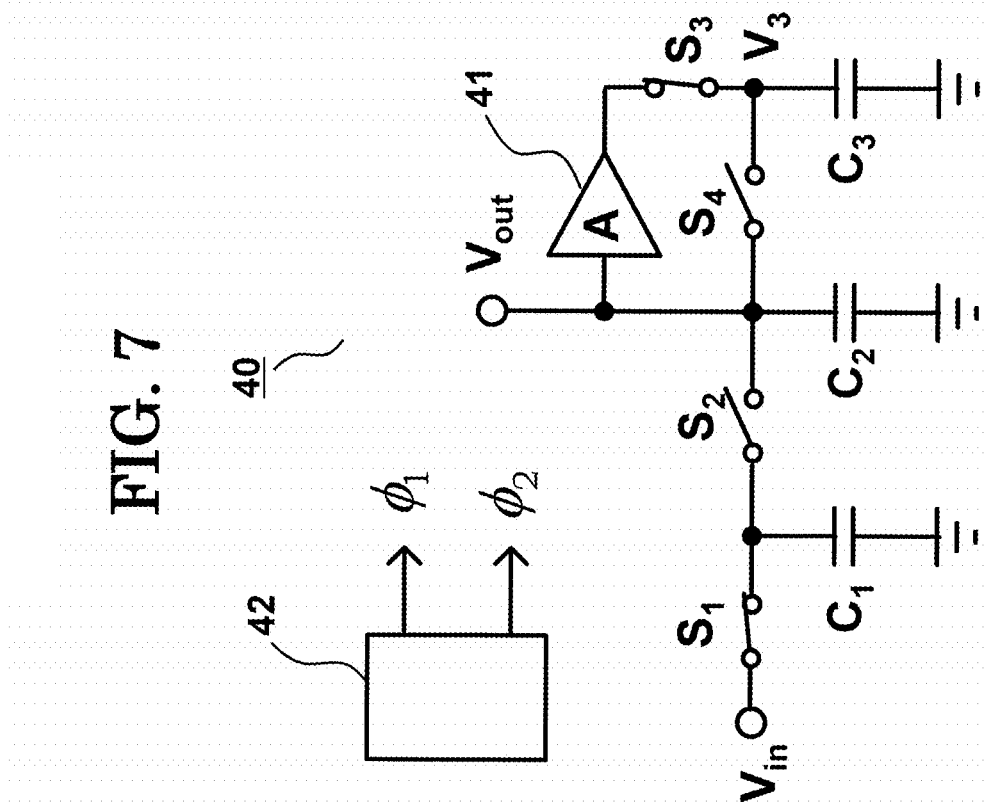
FIG. 7 is a circuit diagram of an integrator according to one embodiment of the present invention.

FIG. 7 shows an integrator 40 according to one embodiment of the present invention. The integrator 40 is configured of three capacitors $C_1$, $C_2$, and $C_3$, four switches $S_1$, $S_2$, $S_3$, and $S_4$, and one amplifier 41. The capacitor $C_1$ is a capacitor which mainly retains an input voltage $V_{in}$. The capacitor $C_2$ is a capacitor which mainly retains a previous output voltage $V_{out}$. The capacitor $C_3$ is a capacitor which retains a voltage obtained by amplifying a previous output voltage $V_{out}$ by A times.

The switch $S_1$ is inserted between an input terminal supplied with the input voltage $V_{in}$ and one end of the capacitor $C_1$. The other end of the capacitor $C_1$ is connected to a reference voltage terminal (ground). One end of the capacitor $C_2$ is connected to an output terminal where $V_{out}$ appears, and the other end of the capacitor $C_2$ is connected to the reference voltage terminal (ground). The switch $S_2$ is inserted between the one end of the capacitor $C_1$ (also one end of the switch $S_1$) and the one end of the capacitor $C_2$ (also the output terminal). The switch $S_4$ is inserted between the one end of the capacitor $C_2$ (also the output terminal) and one end of the capacitor $C_3$ (also one end of the switch $S_3$). The other end of the capacitor $C_3$ is connected to the reference voltage terminal (ground). An input of the amplifier 41 is coupled to the one end of the capacitor $C_2$ (also the output terminal), and the switch $S_3$ is inserted between an output of the amplifier 41 and the one end of the capacitor $C_3$. The switches $S_1$ to $S_4$ can be configured by a transfer gate in which a P-type transistor and an N-type transistor are connected in parallel and driven by a control signal in a complementary manner.

A control circuit 42 generates a control signal $\phi_1$ for controlling the switches $S_1$ and $S_3$ and a control signal $\phi_2$ for controlling the switches $S_2$ and $S_4$. In Phase 1, the control circuit 42 performs control so that the input signal is sampled in the capacitor $C_1$ and the voltage remaining in the capacitor $C_2$ is amplified by the amplifier 41 by A times in gain to appear at the capacitor $C_3$. In phase 2, the control circuit 42 performs control so that a voltage occurring due to parallel connection of the capacitors $C_1$, $C_2$, and $C_3$ is taken as an output. Thus, a voltage at the output terminal is amplified by the amplifier 41.

Figure 8:
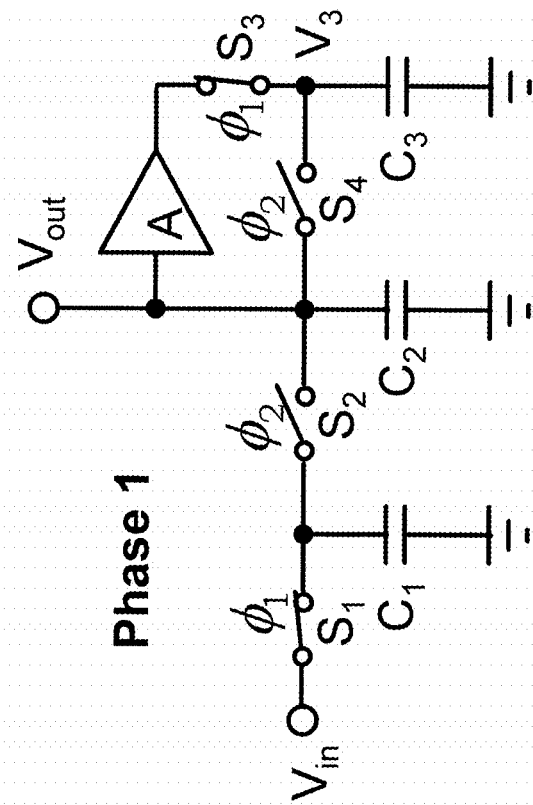
FIG. 8 is a diagram for describing operation of the integrator according to one embodiment of the present invention.
Figure 9:
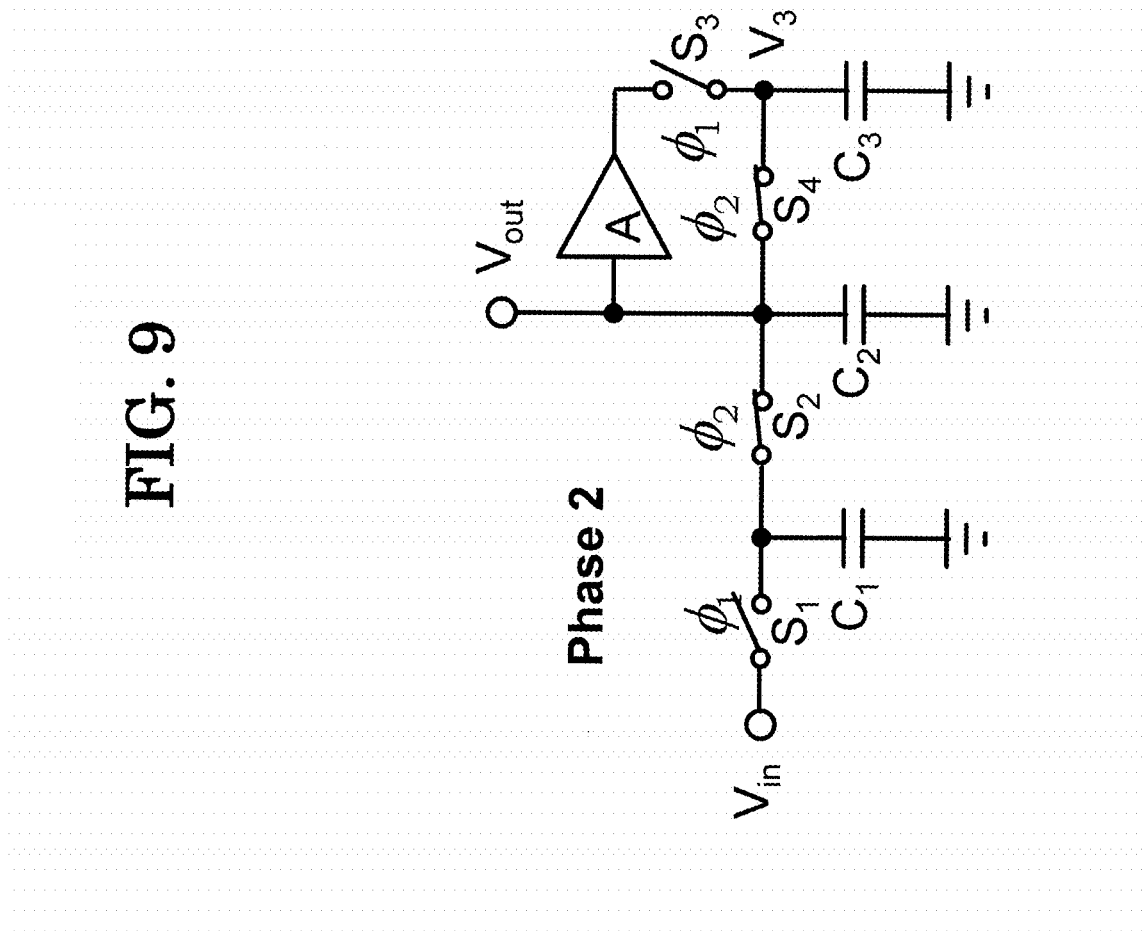
FIG. 9 is a diagram for describing operation of the integrator according to one embodiment of the present invention.

FIG. 8 and FIG. 9 are diagrams for describing operation of the integrator 40 according to one embodiment of the present invention. In Phase 1, the control circuit 42 renders the switches $S_1$ and $S_3$ closed (turn on), and the switches $S_2$ and $S_4$ open (turn off). This state is shown in FIG. 8. The input voltage $V_{in}$ is applied to the capacitor $C_1$. A voltage obtained by amplifying the previous output voltage $V_{out}[n-1]$ by A times in gain is applied to the capacitor $C_3$. Charges $Q_1$, $Q_2$, and $Q_3$ accumulated in the capacitors $C_1$, $C_2$, and $C_3$ in this state are represented by the following equations (7-1) to (7-3), respectively.

$$Q_1 = C_1 V_{in} \tag{7-1}$$

$$Q_2 = C_2 V_{out}[n-1] \tag{7-2}$$

$$Q_3 = A \cdot C_3 V_{out}[n-1] \tag{7-3}$$

Next, in Phase 2, the control circuit 42 renders the switches $S_2$ and $S_4$ closed (turn on), and the switches $S_1$ and $S_3$ open (turn off). Here, the three capacitors are all connected in parallel and have a voltage of $V_{out}(n)$, which is represented by the following equation (8).

$$V_{out}[n] = (Q_1 + Q_2 + Q_3)/(C_1 + C_2 + C_3) \tag{8}$$
$$= (C_1 V_{in} + (C_2 + A \cdot C_3) V_{out}[n-1])/(C_1 + C_2 + C_3)$$

Here, constants are defined by the following equations (9-1) and (9-2).

$$C_1 = (A-1) \cdot C_3 \tag{9-1}$$

$$K = C_1/(C_1+C_2+C_3) \tag{9-2}$$

Then, $V_{out}(n)$ is represented by the following equation (10).

$$V_{out}[n] = V_{out}[n-1] + KV_{in} \tag{10}$$

That is, integrating operation is achieved in the circuit of FIG. 7. The values of the above constants are defined by the following equations (11-1) to (11-4) by using a unit capacitor $C_U$.

$$C_1 = 2C_U \tag{11-1}$$

$$C_2 = C_U \tag{11-2}$$

$$C_3 = C_U \tag{11-3}$$

$$A = 3 \tag{11-4}$$

Then, $V_{out}(n)$ is represented by the following equation (12).

$$V_{out}[n] = V_{out}[n-1] + (\tfrac{1}{2})V_{in} \tag{12}$$

As described above, in the present invention, an integrator can be configured even without a negative feedback circuit. The present invention can solve the problems of instability and low-speed operation in the conventional integrator and can achieve a stable and high-speed integrator.

While a single-phase integrator 40 is shown in FIG. 7, the integrator can also be configured to deal with a complementary signal. In addition, the integrator 40 may include, as required, an input buffer or an input amplifier and an output buffer or an output amplifier.

(A Dynamic Type Amplifier)

In the integrator 40 of FIG. 7, a dynamic type amplifier where a steady-state current does not flow can be used as the amplifier 41 to obtain a great advantage. Consumption energy $E_d$ of the dynamic type amplifier is determined mainly by charge/discharge current of the output capacitor $C_L$. Therefore, an ideal power characteristic can be obtained such that power consumption is proportional to the clock frequency and, although power is consumed to some degree in high-speed operation, if the clock frequency is decreased, power consumption is decreased. Thus, unlike the conventional integrator, it is not required to control the bias current every time the clock frequency is changed. In addition, since no constant-state current flow, an integration circuit operating with significantly low power consumption can be achieved.

Figure 10:
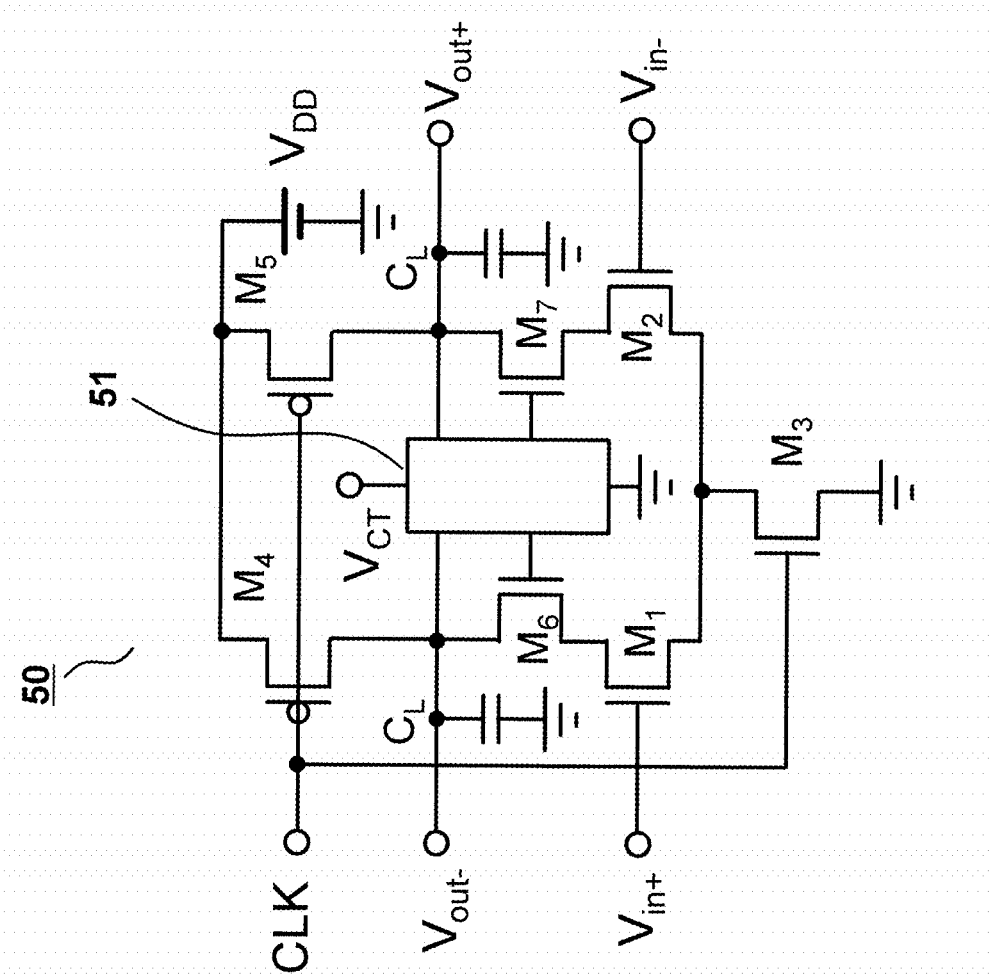
FIG. 10 is a circuit diagram of a dynamic type amplifier according to one embodiment of the present invention.

FIG. 10 shows a dynamic type amplifier 50 according to one embodiment of the present invention. The drain of an N-type transistor $M_3$ is connected to the common source of N-type transistors $M_1$ and $M_2$ configuring paired differential transistors (discharging circuit). A positive input $V_{in+}$ is supplied to the gate of the N-type transistor $M_1$, and an inverting input $V_{in-}$ is supplied to the gate of the N-type transistor $M_2$. A clock signal CLK is supplied to the gate of the N-type transistor $M_3$, and its source is grounded. The clock signal CLK is supplied to both of the gates of P-type transistors $M_4$ and $M_5$ as loads, and their sources are both supplied with the power supply voltage $V_{DD}$ (pre-charging circuit). The drain of the P-type transistor $M_4$ is connected to an inverting output terminal, where the output capacitor $C_L$ is present. The voltage $V_{out-}$ appears at the inverting output terminal. An N-type transistor $M_6$ is inserted between the drain of the P-type transistor $M_4$ and the drain of the N-type transistor $M_1$. The drain of the P-type transistor $M_5$ is connected to a positive output terminal, where the output capacitor $C_L$ is present. The voltage $V_{out+}$ appears at the positive output terminal. An N-type transistor $M_7$ is inserted between the drain of the P-type transistor $M_5$ and the drain of the N-type transistor $M_2$. An output voltage of a common voltage detection/control circuit 51 is supplied to the gates of the N-type transistors $M_6$ and $M_7$. The common voltage detection/control circuit 51 is controlled by a control signal $V_{CT}$ and also by each of the voltages $V_{out-}$ and $V_{out+}$ of the positive and inverting output terminals.

Figure 11:
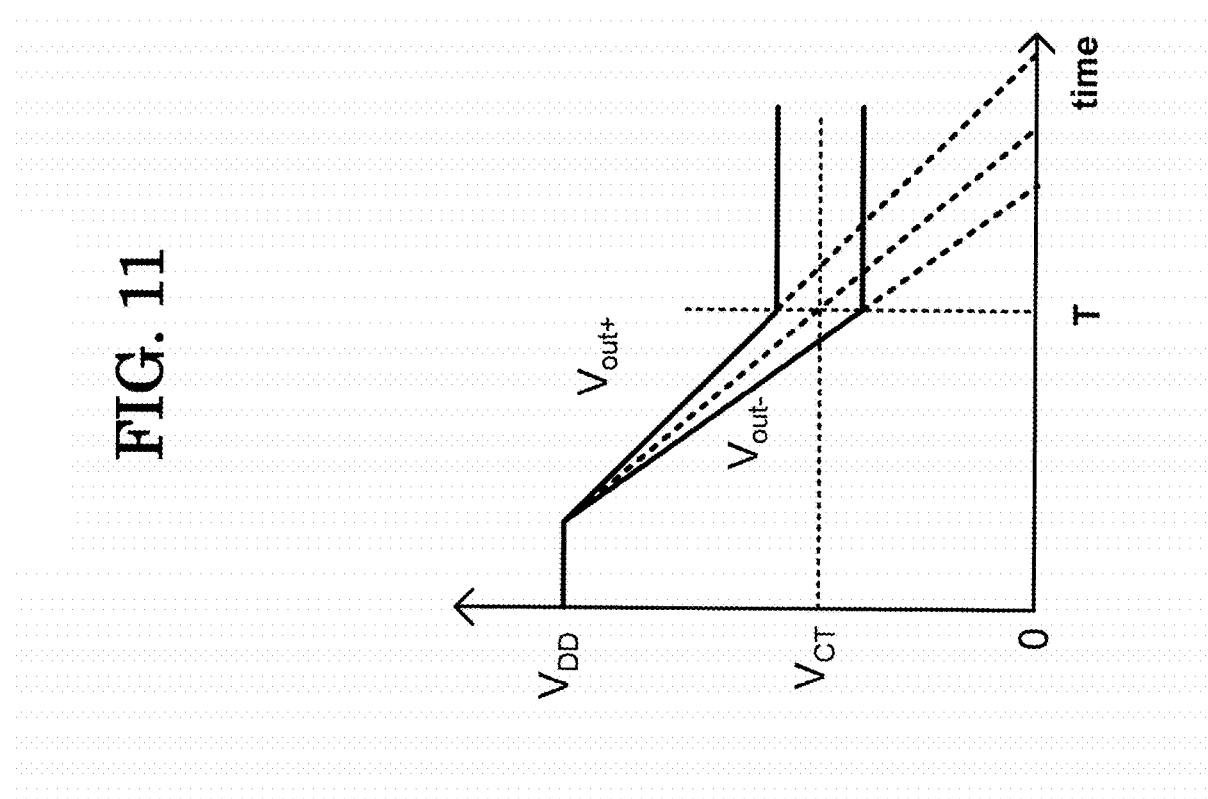
FIG. 11 is a graph showing operation of the dynamic type amplifier according to one embodiment of the present invention.

The operation of the dynamic type amplifier 50 is described by using temporal changes of the output voltages $V_{out+}$ and $V_{out-}$ of FIG. 11.

First, the clock signal CLK is set at a ground level. In this state, the N-type transistor $M_3$ is interrupted, and no current flows through the N-type transistors $M_1$ and $M_2$. As a result, the output voltages $V_{out+}$ and $V_{out-}$ both become the power supply voltage $V_{DD}$, and the output capacitor $C_L$ is pre-charged at $V_{DD}$.

Next, the clock signal CLK is raised to a $V_{DD}$ level. The P-type transistors $M_4$ and $M_5$ become unconductive, and the N-type transistor $M_3$ becomes conductive. As a result, current flows through the N-type transistors $M_1$ and $M_2$. Here, the common voltage detection/control circuit 51 supplies an operating voltage so that the transistors $M_6$ and $M_7$ become in an ON state. The current of the N-type transistors $M_1$ and $M_2$ acts so as to draw the charge accumulated in the output capacitor $C_L$, thereby decreasing both the output voltages $V_{out+}$ and $V_{out-}$. Currents $ID_1$ and $ID_2$ flowing through the N-type transistors $M_1$ and $M_2$ are represented by the following equations (13-1) and (13-2), where transconductance is $g_m$, $I_{D0}$ is an average current of $ID_1$ and $ID_2$, and $\Delta V_{in} = V_{in+} - V_{in-}$.

$$I_{D1} = I_{D0} + g_m(\Delta V_{in}/2) \tag{13-1}$$

$$I_{D2} = I_{D0} - g_m(\Delta V_{in}/2) \tag{13-2}$$

Therefore, the output voltages $V_{out+}$ and $V_{out-}$ are represented by the following equations (14-1) and (14-2).

$$V_{out+} = V_{DD} - I_{D2}t/C_L \tag{14-1}$$

$$V_{out-} = V_{DD} - I_{D1}t/C_L \tag{14-2}$$

A differential gain $G_d$ is found and represented by the following equation (15) where $\Delta V_{out} = V_{out+} - V_{out-}$.

$$G_d = \Delta V_{out}/\Delta V_{in} = g_m(t/C_L) \tag{15}$$

Here, an output common voltage $V_C$ is defined as $V_C = (V_{out+} + V_{out-})/2$, this is represented by the following equation (16).

$$V_C = V_{DD} - I_{D0}t/C_L \tag{16}$$

When a change of the output common voltage $V_C$ from the power supply voltage is $-\Delta V_C$, $\Delta V_C$ is represented by the following equation (17).

$$\Delta V_C = I_{D0}t/C_L \tag{17}$$

When the equation (15) is substituted for the equation (17), the following equation (18) holds.

$$\begin{aligned} G_d &= g_m(\Delta V_C / I_{D0}) \\ &= (2I_{D0}/V_{eff}) \cdot (\Delta V_C / I_{D0}) \\ &= 2\Delta V_C / V_{eff} \end{aligned} \tag{18}$$

Here, $V_{eff}$ is the effective gate voltage ($V_{GS} - V_T$). Therefore, the differential gain $G_d$ can be achieved by detecting a common mode voltage and turning off the N-type transistors $M_6$ and $M_7$ when the voltage becomes the set voltage $V_{CT}$.

The output voltage after interruption is retained. This turning off in the N-type transistors $M_6$ and $M_7$ is controlled by the common voltage detection/control circuit 51.

The consumption energy Ea of this dynamic type amplifier is determined mainly by a charge/discharge current of the output capacitor $C_L$, and is represented by the following equations (19) and (20).

$$E_d = 2C_L V_{DD}(V_{DD} - V_{CT}) \quad (19)$$

$$E_d = 2C_L V_{DD} \Delta V_C = C_L V_{DD} G_d V_{eff} \quad (20)$$

Power consumption $P_d$ is represented by the following equation (21), where the clock frequency is $f_{CLK}$.

$$P_d = f_{CLK} E_d = f_{CLK} C_L V_{DD} G_d V_{eff} \quad (21)$$

Therefore, an ideal power characteristic can be obtained such that power consumption is proportional to the clock frequency and, although power is consumed to some degree in high-speed operation, if the clock frequency is decreased, power consumption is decreased accordingly in proportion to the decrease. Thus, unlike the conventional integrator, it is not required to control the bias current every time the clock frequency is changed. In addition, since no steady-state current flows, an integration circuit operating with significantly low power consumption can be achieved. It goes without saying that intermittent operation can be easily realized.

(A Connection Mode of Integrators for Use in Delta-sigma Converter)

Figure 12:
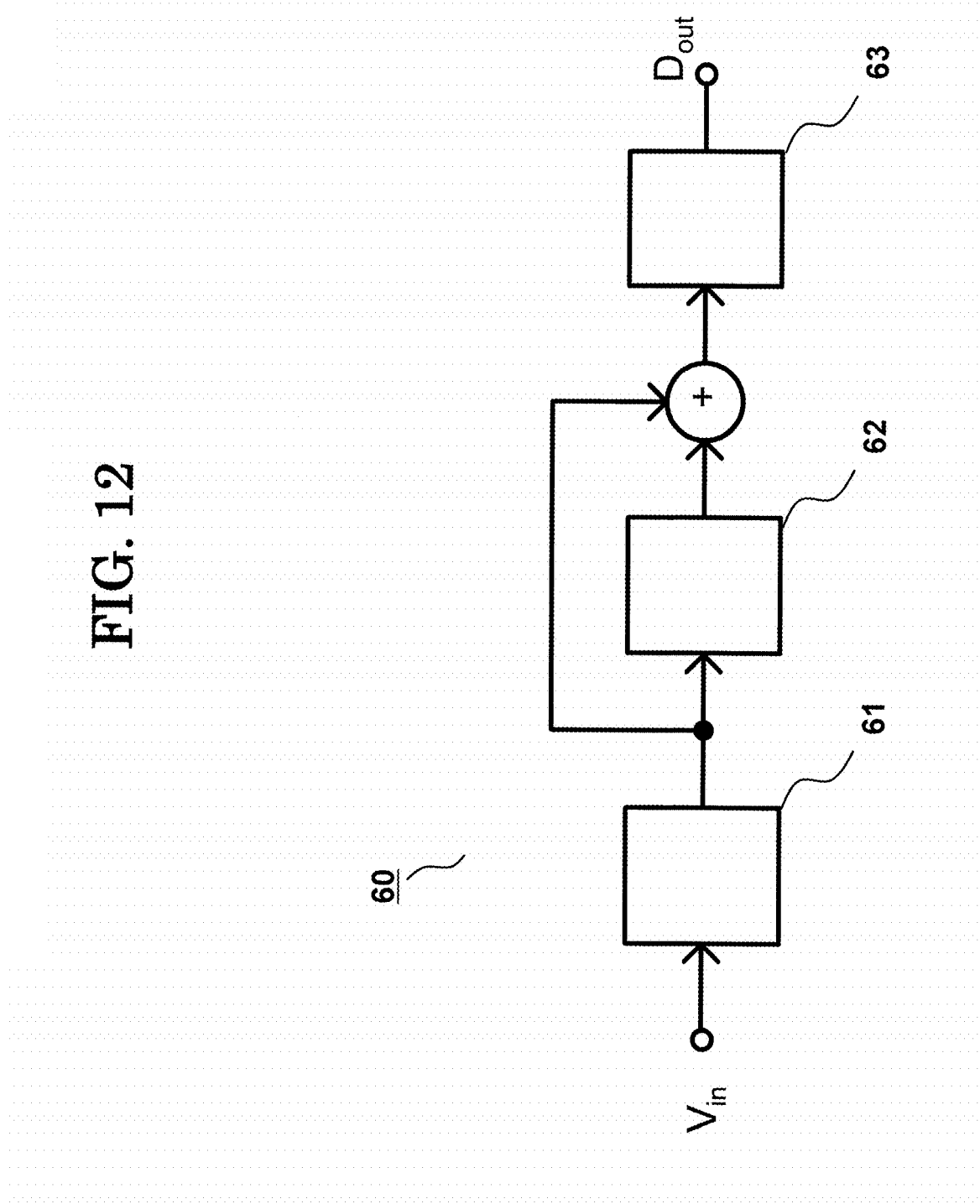
FIG. 12 is a circuit diagram of an integrator for use in a delta-sigma A/D converter according to one embodiment of the present invention.

FIG. 12 shows a delta-sigma converter 60 according to one embodiment of the present invention. This includes a first integrator 61, a second integrator 62, and a quantizer 63. As each of the integrators 61 to 63, an integrator 40 shown in FIG. 7 is used, and the amplifier 41 included in that integrator is a dynamic type amplifier 50 shown in FIG. 10. The input voltage $V_{in}$ is inputted to the first integrator 61. To the quantizer 63 to which an output from the second integrator 62 is supplied, a value acquired by adding outputs from the first integrator and the second integrator together is supplied. In this manner, a so-called feed-forward path is provided for phase compensation.

(An A/D Converter in Composite Structure)

When the delta-sigma converter 60 including the integrator 40 using the dynamic type amplifier 50 according to one embodiment of the present invention is combined with a successive approximation A/D converter (SAR ADC), as described above, a higher-speed, lower-power-consumption A/D converter can be achieved. A successive approximation A/D converter 70 uses capacitors and a dynamic comparator.

Figure 13:
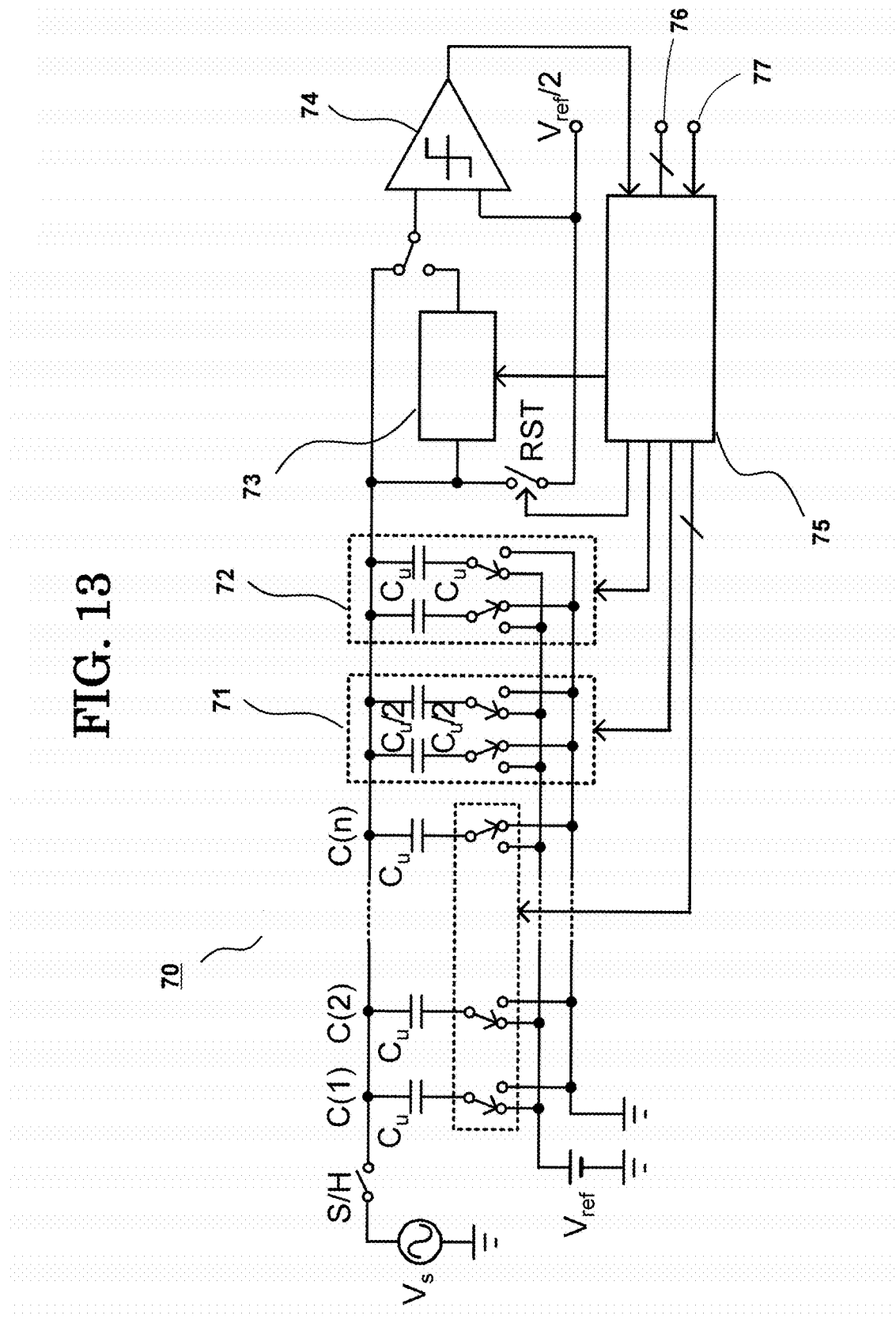
FIG. 13 is a circuit diagram of an A/D converter in a composite structure according to one embodiment of the present invention.

FIG. 13 shows the A/D converter 70 in a composite structure. On a signal line to which an input terminal supplied with the input voltage $V_{in}$ leads, n capacitors are connected in parallel each at one end, via a switch, where $n=2^N$ when N is a resolution of the successive approximation A/D converter. Each capacitance value is $C_U$. For a voltage shift of LSB/2 of the successive approximation A/D converter required for delta-sigma A/D conversion, two level shift capacitors 71 are provided to set the capacitance at $C_U/2$, with one terminal connected in parallel to the n capacitors and the other end of one capacitor connected at the reference voltage $V_{ref}$ and that of the remaining capacitor connected to the ground in an initial state. Similarly, for a voltage shift of +LSB or −LSB of the successive approximation A/D converter required as an internal D/A conversion function of the delta-sigma A/D converter for delta-sigma A/D conversion, two D/A conversion capacitors 72 are provided to set the capacitance as $C_U$, with one terminal connected in parallel to the n capacitors and the other end of one capacitor connected at the reference voltage $V_{ref}$ and that of the other capacitor connected to the ground in an initial state. A comparator 74 has a reference voltage of $V_{ref}/2$. Initially, a half of the capacitors has its other end connected at the reference voltage $V_{ref}$ and the remaining half thereof has its other end grounded.

The input signal $V_{in}$ is applied to parallel connection points of the capacitors when a switch S/H is closed, and is held in each capacitor as a charge at a timing when the switch S/H is opened.

In the first A/D conversion, in this state, the comparator 74 compares the held input signal $V_{in}$ and $V_{ref}/2$ with each other to determine 1 or 0 of a MSB bit. Next, in accordance with this comparison result, a control logic operates, and the other end of 3n/4 or n/4 capacitors is connected to $V_{ref}$, and the remaining capacitors are connected to the ground. The comparator 74 compares the voltage at a common connection point of the capacitors and $V_{ref}/2$ with each other to determine a conversion bit of the second bit. Thereafter, similar operation is repeated N times to end successive approximation A/D conversion operation.

Next, the process proceeds to delta-sigma A/D conversion operation. First, the input of the comparator 74 selects an output of the integrator 73, and the switch of the level shift capacitor is controlled to switch the other end of the level shift capacitor from the ground to $V_{ref}$, thereby achieving an LSB/2 shift. In addition, by switching from $V_{ref}$ to the ground, a −LSB/2 shift is achieved. In this manner, the input voltage range is appropriately set. In accordance with the output state of the comparator 74, the other end of the D/A conversion capacitor is switched, thereby allowing delta-sigma A/D conversion operation to be achieved in a voltage-overlapped state.

In delta-sigma A/D conversion operation, after the input signal is sampled once, there are an operation mode in which the input signal is not sampled for each clock and delta-sigma A/D conversion is successively performed and an operation mode in which the input signal is sampled for each clock when the comparator operates. The former operation mode has advantages that A/D conversion is at higher speeds and operation is performed with low power consumption, but has a problem that kT/C noise induced at the time of sampling the input signal cannot be removed. The latter operation mode has problems that A/D conversion is at slightly low speeds and power consumption is slightly increased, but has an effect that kT/C noise induced at the time of sampling the input signal is reduced to 1/oversampling ratio M. Either operation mode can be taken depending on the specifications of the sensor device. However, at the time of sampling, when the state of the switch connected to the capacitors is returned to an initial state, the voltage at the common connection end of the capacitors is returned to the input voltage $V_{in}$, and thus the load capacitance drive of the input signal is lightened, and the time required for driving and power consumption are advantageously decreased. After signal resampling, the state of the switch connected to the capacitors is reset again in accordance with the successive conversion result, and then delta-sigma A/D conversion is performed. The clock number required for delta-sigma A/D conversion is externally set. When the clock number reaches a set value, delta-sigma A/D conversion ends, the conversion result is outputted, and the integrator is reset. In addition, the charge of each capacitor is reset by a reset switch as required, and then the state is returned to an initial state, and the process enters successive approximation A/D conversion operation. The above-described process is repeated.

(A/D Converter in Composite Structure)

Figure 14:
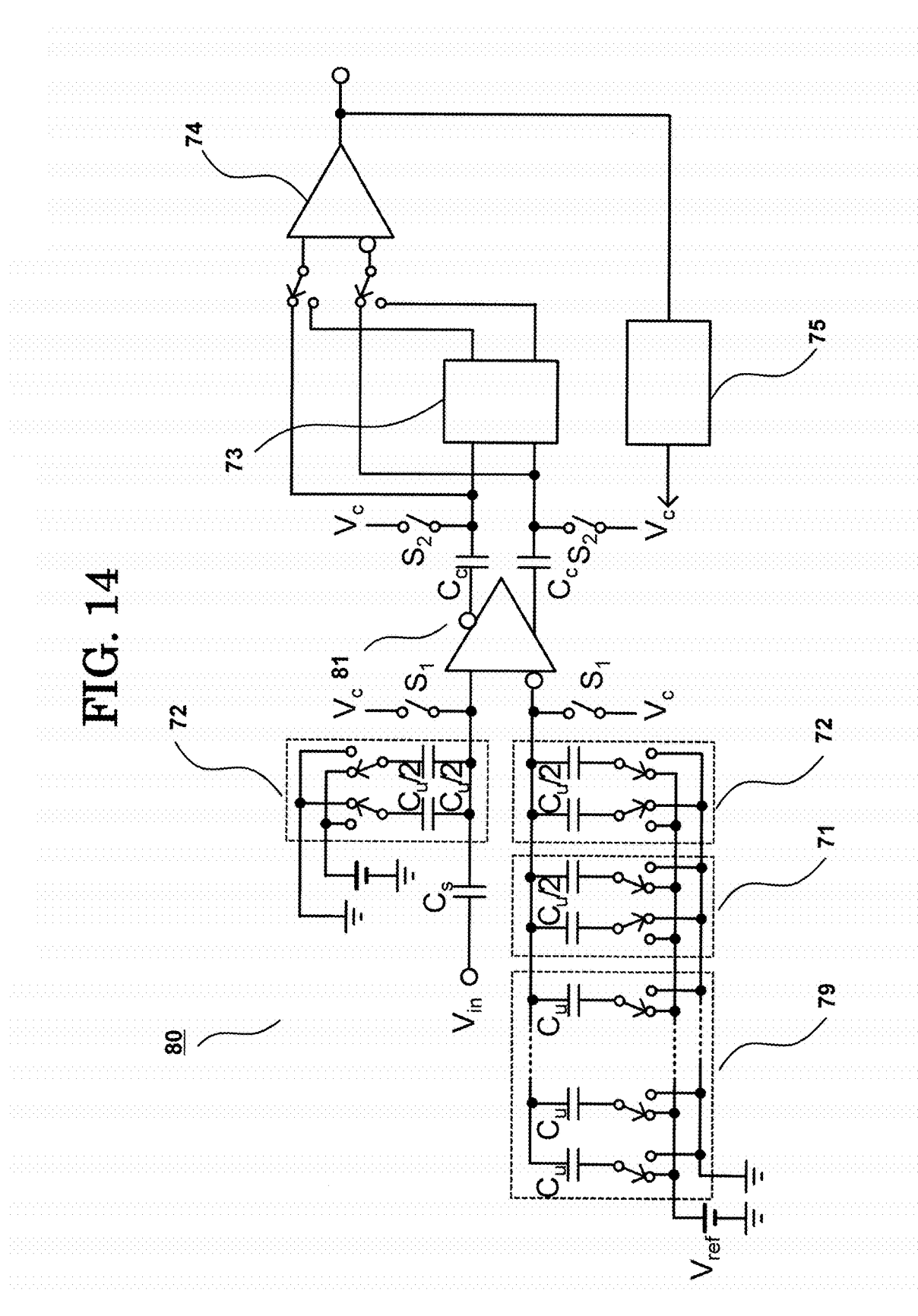
FIG. 14 is a circuit diagram of an A/D converter in a composite structure according to one embodiment of the present invention.

FIG. 14 shows an A/D converter in a composite structure for performing correlated double sampling not singly but in combination with analog circuit technology. An A/D converter 80 uses a differential amplifier 81. The differential amplifier 81 generates, between paired output signal ends, a differential voltage acquired by amplifying a differential input voltage at paired input signal ends.

On a signal line to which an input terminal supplied with the input voltage $V_{in}$, two D/A conversion capacitors 72 for delta-sigma A/D conversion with a capacitance of $C_U/2$ are connected in parallel each at one end, via a capacitor $C_S$, and the signal line is coupled to one input terminal of a differential amplifier 81. The other end of one D/A conversion capacitor 72 for delta-sigma A/D conversion is connected at the reference voltage $V_{ref}$, and that of the remaining D/A conversion capacitor 72 for delta-sigma A/D conversion is connected to the ground in an initial state. To the other input terminal of the differential amplifier 81, two D/A conversion capacitors 72 for delta-sigma A/D conversion with a capacitance of $C_U/2$ are connected in parallel, with the other end of one capacitor connected at the reference voltage $V_{ref}$ and that of the remaining capacitor connected to the ground. Similarly, two level shift capacitors 71 with a capacitance of $C_U/2$ are provided, with one end connected in parallel to the D/A conversion capacitors 72 and the other end of one capacitor connected at the reference voltage $V_{ref}$ and that of the remaining capacitor connected to the ground in an initial state. In parallel to the level shift capacitors 71, n capacitors (capacitive D/A convertors) 79 each configuring a successive A/D converter are connected each at one end, where $n=2^N$ when N is a resolution of the successive approximation A/D converter, with the other end of each capacitor having one connected to the reference voltage $V_{ref}$ and the remaining one connected to the ground in an initiate state. Each capacitance value is $C_U$. A half of the capacitors has its other end connected at the reference voltage $V_{ref}$ and the remaining half thereof has its other end grounded.

The paired input terminals of the differential amplifier 81 are each connected via a switch $S_1$ at a common voltage $V_c$. To the paired output terminals of the differential amplifier 81, paired capacitors are connected, and are each connected via a switch $S_2$ at the common voltage $V_c$.

First, it is assumed that the switches $S_1$ and $S_2$ are closed. The input signal $V_{in}$ is applied to the capacitor $C_S$. Simultaneously, a switch of the capacitor 79 configuring a successive A/D converter is controlled so that $\beta V_{ref}$ is equivalently applied to the capacitor. Here, $\beta$ is a proportional coefficient from 0 to 1. In the level shift capacitor 71 formed of two unit capacitors $C_U/2$ and the D/A conversion capacitor 72 for delta-sigma A/D conversion, it is assumed that one capacitor selects $V_{ref}$ and the other capacitor selects the ground. Since the switch $S_2$ are closed, the output voltage of the differential amplifier 81 is level-shifted to capacitors $C_c$, and an output offset voltage is accumulated thereat. Here, the input signal $V_{in}$ is a reset signal $V_{RST}$.

Next, the switches $S_1$ and $S_2$ are opened for A/D conversion. First, a control circuit 75 controls a switch of the capacitor 79 configuring a successive A/D converter for successive approximation A/D conversion. After successive approximation A/D conversion, the process proceeds to delta-sigma A/D conversion. An input of the comparator 74 selects an output of the integrator 73.

Next, the level shift capacitor 71 is controlled for level shift. Then, the D/A conversion capacitor 72 for delta-sigma A/D conversion is controlled for delta-sigma A/D conversion. Compared with the embodiment shown in FIG. 13, the circuit is of not a single end type but a differential type, and thus more accurate A/D conversion with less distortion or noise can be performed. To enhance differential capability, it is desired to match the capacitance of the capacitor $C_S$ and the total capacitance of the capacitor 79 configuring a successive A/D converter. Meanwhile, in the above-described A/D conversion, a signal as a conversion target is kT/C noise and offset voltage of a circuit system accompanying signal sampling, and their voltages are subtle. Thus, the structure can be such that first successive approximation A/D conversion is omitted and A/D conversion is performed only by delta-sigma A/D conversion.

Next, $V_{in}$ is changed to a signal voltage $V_{sig}$ of a sensor or the like. As with the previous step, the control circuit 75 first controls the switch of the capacitor 79 configuring a successive A/D converter for successive approximation A/D conversion. After successive approximation A/D conversion, the process proceeds to delta-sigma A/D conversion. An input of the comparator 74 selects an output of the integrator 73. Furthermore, the level shift capacitor 71 is controlled for level shift. Then, the D/A conversion capacitor 72 for delta-sigma A/D conversion is controlled for delta-sigma A/D conversion. From the A/D acquired conversion value, the A/D conversion value acquired with the reset signal $V_{RST}$ is subtracted to acquire a change of the signal $V_{sig}$ from the reset voltage $V_{RST}$, thereby achieving correlated double sampling. In this method, it is not required to perform signal sampling a plurality of times or returning the D/A conversion capacitor to an initial state, and thus higher speed and lower power consumption can be achieved in A/D conversion. In addition, as described above, more accurate A/D conversion can be performed.

(A Control of Delta-Sigma A/D Converter)

The A/D converter of the present invention includes a successive approximation A/D converter and a delta-sigma A/D converter. With the conversion result of the successive approximation A/D converter taken as an upper conversion result and the conversion result of the delta-sigma A/D converter taken as a lower conversion result, these are combined together to acquire an A/D conversion output. This structure can achieve a low-noise, low-power A/D converter and a sensor device using this A/D converter.

Figure 15:
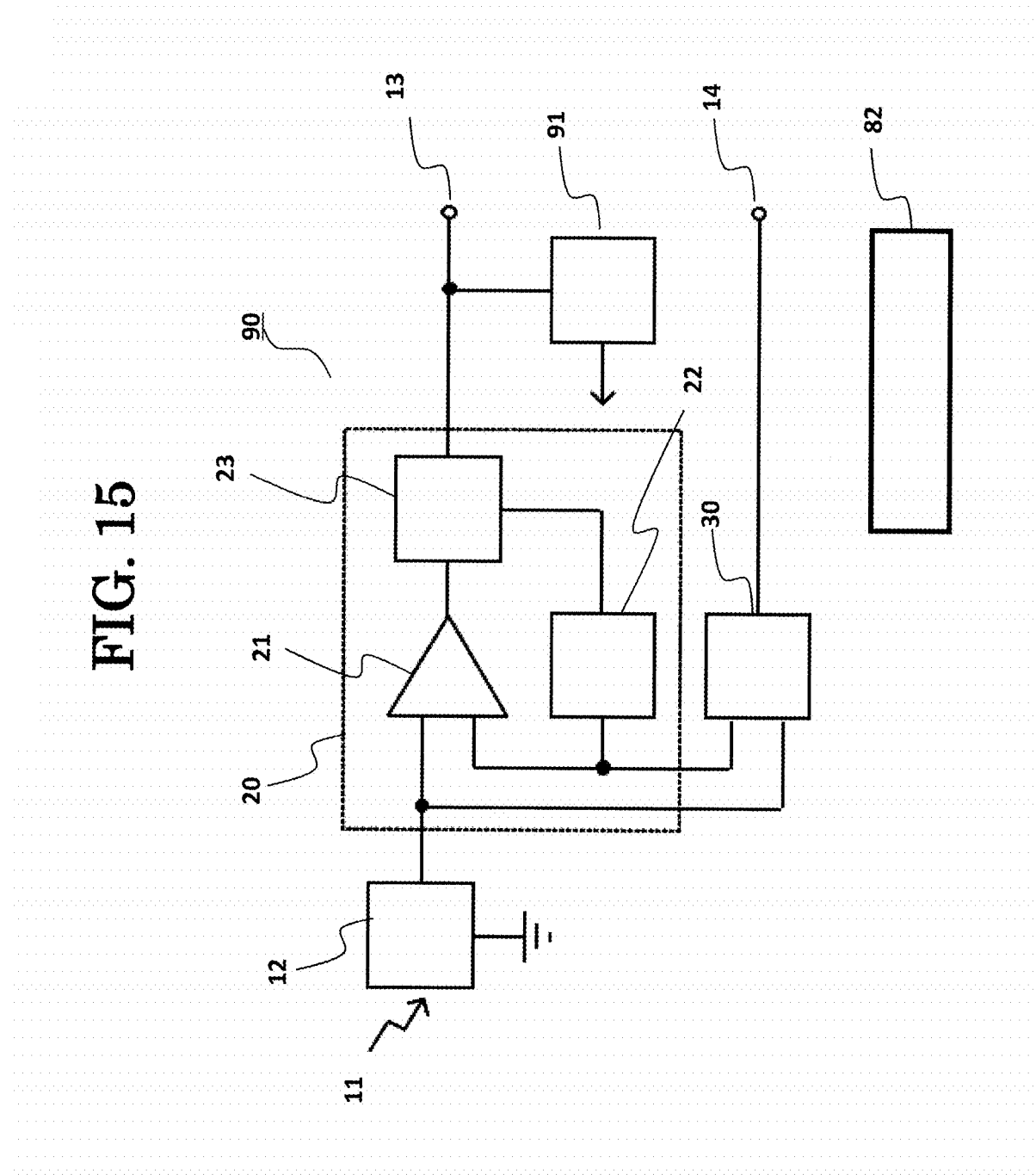
FIG. 15 is a circuit diagram of a sensor device according to another embodiment of the present invention.

FIG. 15 shows an A/D converter 90 using a delta-sigma A/D conversion control mechanism 91 according to one embodiment of the present invention. Portions common to those of FIG. 1 are provided with the same reference numerals, and description of their circuit structures is omitted. In the present embodiment, in addition to the structure shown in FIG. 1, the delta-sigma A/D conversion control mechanism 91 and a setting data storage region 82 are provided. This structure allows the A/D converter of the present embodiment to achieve further significantly low power consumption while maintaining substantial low-noise characteristics.

The delta-sigma A/D conversion mechanism 91 is connected to the upper conversion value terminal 13 to which an output from the A/D converter is supplied. Based on the conversion value, conversion parameters of the delta-sigma A/D converter are controlled, including (a) the usage of the delta-sigma A/D converter, (b) an oversampling ratio, (c) a quantization voltage, and (d) conversion energy (the magnitude of the capacitance of a capacitor element for use).

FIG. 16A is a table for describing operation of the delta-sigma A/D conversion control mechanism 91. By following the conversion value of the signal voltage $V_S$ appearing at the upper conversion value terminal 13, (a) the usage of the delta-sigma A/D converter and (b) its oversampling ratio are switched in accordance with the signal value $V_S$. Specifically, when $V_s \geq V1$, the delta-sigma A/D converter 30 is not operated, and only the successive approximation A/D converter 20 is operated. When $V1 > V_s \geq V2$, the successive approximation A/D converter 20 is operated at 11 bits. When $V2 > V_s \geq V3$, the successive approximation A/D converter 20 is operated at 12 bits. When $V3 > V_s \geq V4$, the successive approximation A/D converter 20 is operated at 13 bits. When $V4 > V_s \geq V5$, the successive approximation A/D converter 20 is operated at 14 bits.

FIG. 16B is a diagram of the setting data storage region 82. In this region, V1, V2, V3, V4, and V5 are held, which are thresholds for switching (a) the usage of the delta-sigma A/D converter and (b) its oversampling ratio. The setting data storage region 82 is configured of a non-volatile memory or volatile register array. The setting parameters such as V1, V2, V3, V4, and V5 are externally set by an external terminal 83. For example, the setting parameters are inputted with command from an output bus of an A/D converter, and are stored in the setting data storage region 82. In the following example, V1 is set at 10 mV, V2 at 2.5 mV, V3 at 600 µV, V4 at 150 µV, and V5 at 40 µV.

Figure 17:
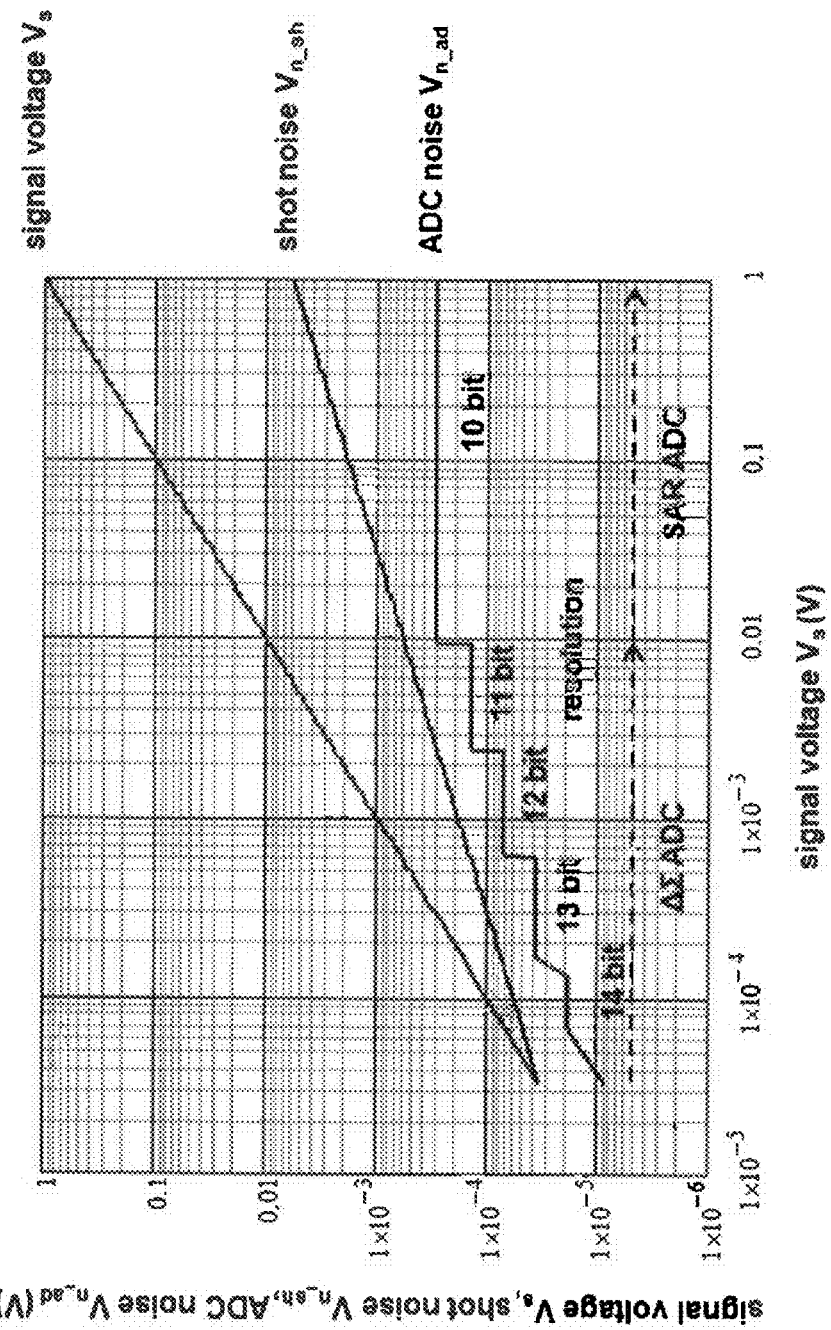
FIG. 17 is a graph showing a relation among signal voltage and shot noise of the image sensor, and resolution and noise of the A/D converter according to the other embodiment of the present invention.

FIG. 17 shows a relation among the signal voltage $V_S$ and shot noise $V_{n\_sh}$ of the image sensor, and resolution and noise $V_{n\_ad}$ of the A/D converter. When a voltage conversion gain per electron is $G_e$, the signal voltage $V_s$ and the shot noise $V_{n\_sh}$ with respect to the number of electrons n are represented as follows.

$$V_s = G_e n \quad (22)$$

$$V_{n\_sh} = G_e n^{1/2} \quad (23)$$

The noise $V_{n\_ad}$ of the A/D converter desirably has a voltage smaller than η times that of the shot noise $V_{n\_sh}$ (η<1). Since η=0.5 is considered as a desirable value, the necessary resolution of the A/D converter should be evaluated by using this value. The practical resolution of the successive approximation A/D converter is on the order of 10 bits, and thus only the successive approximation A/D converter may be used when the signal voltage $V_s$ is 10 mV or more. However, when the signal voltage is smaller than 10 mV, the necessary resolution can be acquired by using the delta-sigma A/D converter.

On the other hand, increasing the resolution of the A/D converter and decreasing the noise level invite an increase of conversion energy of the A/D converter. It is known that the conversion energy $E_d$ of the A/D converter has the following relation, by using the noise $V_{n\_ad}$ of the A/D converter.

$$E_d = K/V_{n\_ad}^2 \quad (24)$$

Here, K is a proportional coefficient. As described above, the noise $V_{n\_ad}$ of the A/D converter desirably has a voltage smaller than η times that of the shot noise $V_{n\_sh}$(η<1). Here, if $V_{n\_ad} = \eta V_{n\_sh}$, $$V_{n\_ad} = \eta (G_e V_s)^{1/2} \quad (25)$$

Therefore, the following equation can be acquired.

$$E_d = K/(\eta G_e V_s) \quad (26)$$

The conversion energy $E_d$ of the A/D converter is inversely proportional to the signal level $V_s$. That is, the lower signal voltage requires higher conversion energy.

Figure 18:
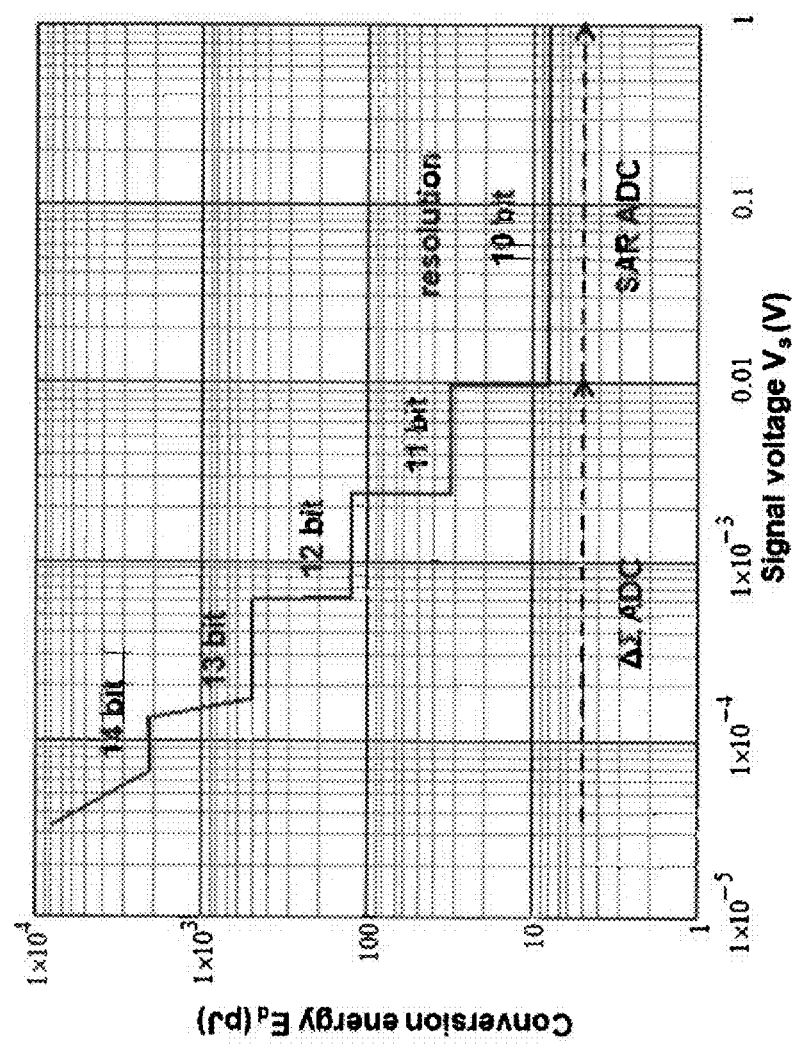
FIG. 18 is a graph showing a relation between signal voltage and conversion energy of the A/D converter according to the other embodiment of the present invention.

FIG. 18 shows the required conversion energy with respect to the signal voltage $V_s$ and the resolution of the A/D converter. When the signal voltage $V_s$ is 10 mV or higher, a successive approximation A/D converter with a resolution of 10 bits is used, requiring only low conversion energy on the order of 8 pJ. When the signal voltage is lower than 10 mV, a delta-sigma A/D converter is used, thereby acquiring a high resolution required for noise reduction. However, the conversion energy is increased, and large energy consumption as much as 2000 pJ is required when the signal voltage is 100 µV. Therefore, if a delta-sigma A/D converter equivalent to 14 bits is used so as to be able to acquire a sufficiently low noise level even when the signal voltage is 100 µV, energy consumption disadvantageously becomes large, as much as 250 times when only a successive approximation A/D converter of 10 bits is used.

This problem can be solved by using the delta-sigma A/D conversion control mechanism 91. In the delta-sigma A/D conversion control mechanism 91, a successive approximation A/D converter on the order of 10 bits or 11 bits is used to acquire a conversion value of the signal voltage $V_s$, and a delta-sigma A/D converter is controlled in accordance with the signal level of the signal voltage $V_s$. For example, when the signal voltage $V_s$ is 10 mV (V1) or higher, delta-sigma A/D conversion is not performed, and only the conversion output value from the successive approximation A/D converter is used. Only when the signal voltage $V_s$ is lower than 10 mV (V1), delta-sigma A/D conversion is performed. In addition in the delta-sigma A/D conversion, the oversampling ratio of the delta-sigma A/D converter is controlled by using the conversion output value of the successive approximation A/D converter and so forth, control can be performed so that desirable A/D conversion noise can be acquired with minimum conversion energy. Conditional branches in this control are as shown in FIG. 16A.

V1 to V5 should be set so as not to exceed the shot noise $V_{n\_sh}$. It is desired that the noise $V_{n\_ad}$ of the A/D converter be smaller than η times (η<1) of the shot noise $V_{n\_sh}$. Since η=½ is desirable, V1 to V5 should be set so that the noise $V_{n\_as}$ of the A/D converter does not exceed a half of the shot noise $V_{n\_sh}$.

In the A/D converter of the present embodiment, when the signal strength is assumed to be uniform to the full scale and a substantial lower-limit value of the signal is assumed to be 100 µV, its conversion energy $E_d$ is found as follows.

$$E_d = 8 \times 0.99 + 8 \times 10^{-2} \int_{1 \times 10^{-4}}^{1 \times 10^{-2}} dV_s = 8.29(pJ) \quad (27)$$

That is, the conversion energy is determined mostly by the consumption energy of the successive approximation A/D converter even if the delta-sigma A/D converter is used, and a significant increase in power consumption can be inhibited.

(Modified Example of Delta-Sigma A/D Converter Control)

As described above, in the present embodiment, the example is described in which the use of the successive approximation A/D converter and the delta-sigma A/D converter is switched with V1 and the oversampling ratio of the delta-sigma A/D converter is switched with three thresholds V2 to V4. However, the number of thresholds is not required to be three, and may be one, two, four or more. In addition, (c) the quantization voltage and (d) the conversion energy (the magnitude of the capacitance of the capacitor element for use) may be switched with V2 to V4. For example, in a region where the signal voltage $V_S$ is low, the quantization voltage is decreased, and accuracy is enhanced while sacrificing power consumption. In a region where the signal voltage $V_S$ is high, the quantization voltage is increased, and accuracy is decreased, thereby allowing power consumption to be decreased. In addition, it is possible to use a large capacitor element configuring a circuit of an integrator or the like in the region where the signal voltage $V_s$ is low and use a small capacitor element configuring a circuit of an integrator or the like in the region where the signal voltage $V_s$ is high. In this case, power consumption is large in the region where the signal voltage $V_s$ is low, but accuracy can be enhanced.

(The Timing of Resolution Determination)

In the foregoing description, the oversampling ratio and the quantization voltage of the delta-sigma A/D converter are controlled in accordance with the signal voltage $V_s$. The signal voltage $V_s$ is acquired by subtracting the reset signal $V_{RST}$ from the voltage $V_o$ including the signal. However, the reset signal $V_{RST}$ is at a timing before the voltage $V_o$ including the signal. If the resolution of A/D conversion of the reset signal $V_{RST}$ is too low, the noise level of the acquired signal cannot be sufficiently decreased even if the resolution of A/D conversion of the voltage $V_o$ including the signal is sufficiently increased in accordance with the signal voltage $V_s$.

Figure 19:
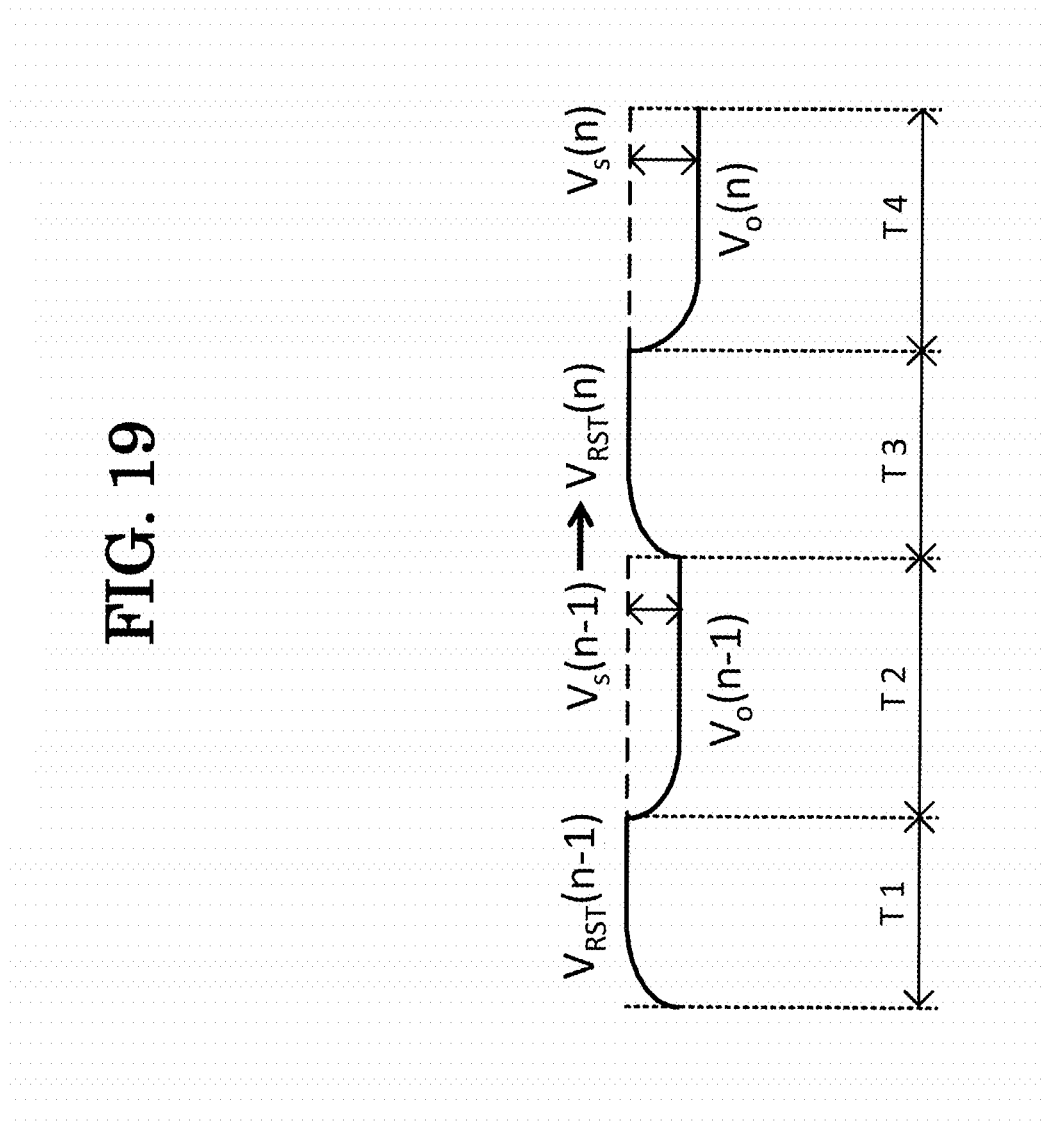
FIG. 19 is a diagram for describing operation of an A/D converter according to still another embodiment of the present invention.

Thus, in the present embodiment, as shown in FIG. 19, when a desired reset signal is $V_{RST}(n)$, the resolution of its A/D conversion is determined by a signal $V_s(n-1)$ at the immediately previous timing. In FIG. 19, the resolution at T3 is determined by the signal $V_s(n-1)$ at T2.

An image requiring high resolution is extremely dark or has similar signal strengths even if the image is bright to a degree. Therefore, a large variance does not occur if the resolution is determined by the signal $V_s(n-1)$ at the immediately previous timing. When the signal strength is significantly varied depending on the pixel, the resolution is on the order of 10 bits determined by the resolution of the successive A/D converter. In this state, the noise level does not pose any problem. In addition, the resolution at the time of conversion of the reset signal is determined by using image correlation. Thus, the resolution may be determined by using, for example, the signal voltage $V_s$ of an adjacent pixel.

In the successive approximation A/D converter, when a capacitive D/A converter is used as an internal D/A converter, a variation amount $\Delta Q$ of the charge flowing through the reference voltage source is varied due to the internal reference voltage $V_{INTREF}$, and is represented by the following equation.

$$\Delta Q = C_s \frac{V_{INTREF}}{V_{FS}}(V_{FS} - V_{INTREF}) \quad (28)$$

Figure 20:
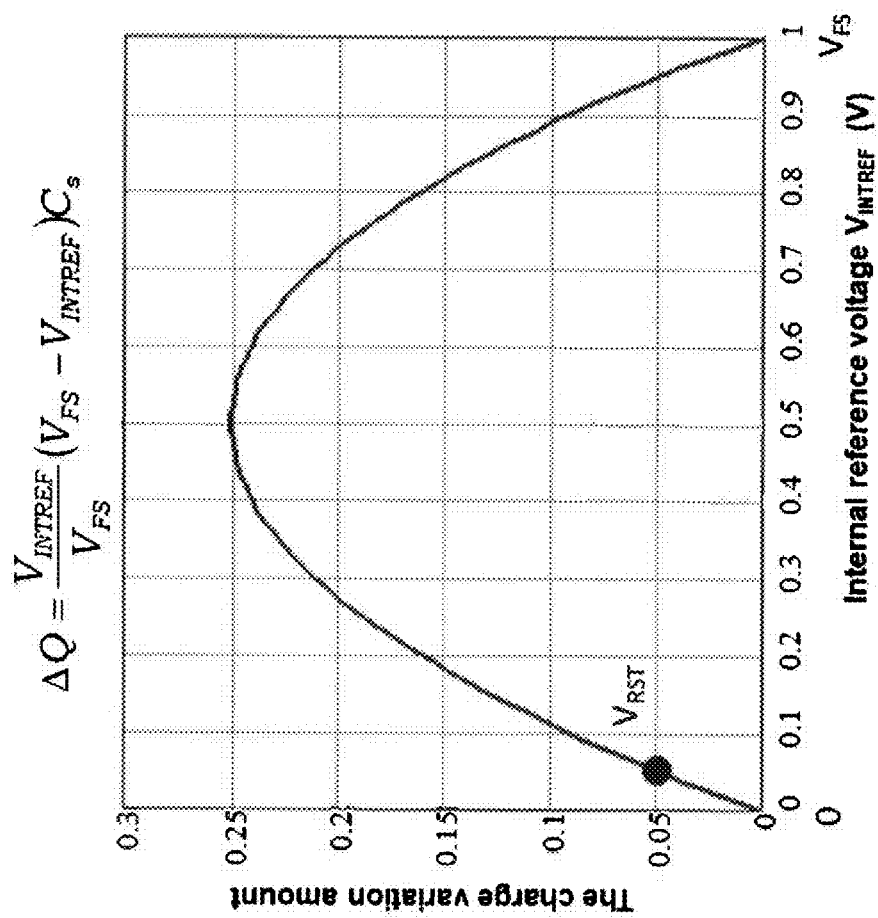
FIG. 20 is a graph showing a relation between internal reference voltage and charge variation amount of the A/D converter according to the other embodiment of the present invention.

Here, $C_s$ is a total capacitance value of the capacitive D/A converter, and $V_{FS}$ is a full-scale voltage of the reference voltage. This state is shown in FIG. 20. The charge variation amount $\Delta Q$ is at maximum when the internal reference voltage $V_{INTREF}$ is a half of the full-scale voltage, that is, $0.25\ C_s V_{FS}$. When the charge variation amount $\Delta Q$ is large, the consumption energy is large, and also a variation of the reference voltage is excited to possibly degrade conversion accuracy. In particular, in the successive approximation A/D converter, the internal reference voltage $V_{INTREF}$ is changed to a half of the full-scale voltage to induce a large charge variation for MSB conversion.

Figure 21:
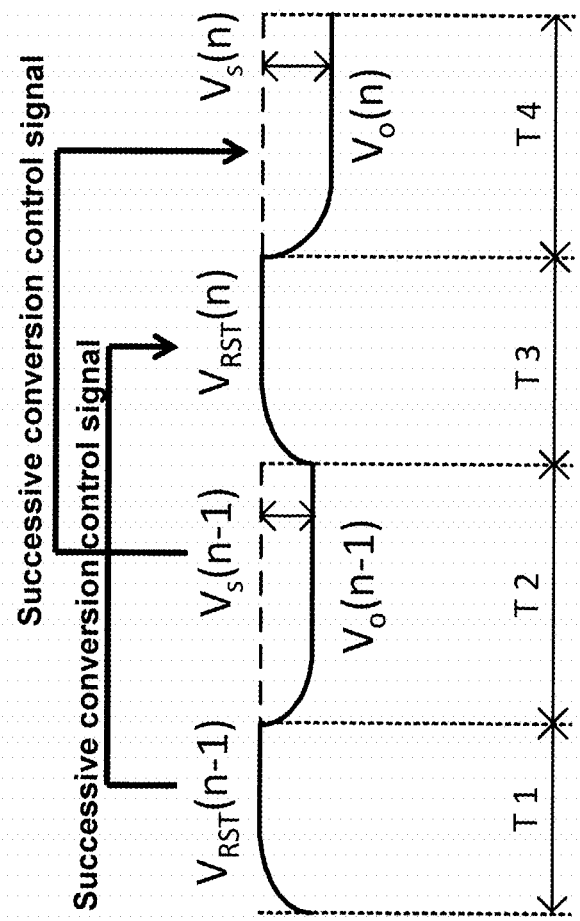
FIG. 21 is a diagram for describing operation of an A/D converter according to still another embodiment of the present invention.

In the present embodiment, as shown in FIG. 21, successive conversion is controlled by using a previous signal such as a signal at the immediately previous timing. In the signal $V_{RST}$ serving as a reference, signal at a differential voltage $V_{DD}-V_{GS}$ between the power supply voltage $V_{DD}$ and a gate-source voltage $V_{GS}$ of the transistor $M_2$ appears. However, the gate-source voltage $V_{GS}$ is almost uniform, and has a distribution on the order of approximately 10 mV in a standard deviation. Even if 3σ is taken by assuming a normal distribution, the distribution is merely on the order of approximately 30 mV, and the full-scale voltage $V_{FS}$ is on the order of 1.0 V. Thus, the same value continues up to five bits or so. In addition, to increase the signal voltage $V_s$ as much as possible, the signal $V_{RST}$ serving as a reference is set at a reference voltage near 0 V. For example, in FIG. 20, when the signal $V_{RST}$ is set at a value on the order of 0.05 with respect to the full-scale voltage $V_{FS}$, the charge variation amount $\Delta Q$ at this time is suppressed to 0.05, which is one fifths of the charge variation amount when MSB conversion is performed.

In the embodiment shown in FIG. 21, by using a successive conversion control signal using data of upper several bits of the conversion value of the signal $V_{RST}(n-1)$ serving as a reference at the immediately previous timing as a previous signal, the internal reference voltage $V_{INTREF}(n)$ is directly generated, thereby performing successive conversion on the remaining bits. This can suppress the charge variation amount $\Delta Q$ to decrease variations of the reference voltage, and also can achieve high-speed conversion and low power consumption.

Furthermore, when the signal voltage $V_s(n-1)$ at the immediately previous timing is smaller than that of the reference signal, the fact that there is a high possibility that the signal voltage $V_s(n)$ is also smaller than the reference value is used. When the signal voltage $V_s(n-1)$ at the immediately previous timing as a previous signal is smaller than the reference value, by using a successive conversion control signal using data of upper several bits of the conversion value of the signal $V_o(n-1)$ at the immediately previous timing, the internal reference voltage $V_{INTREF}(n)$ is directly generated, thereby performing successive conversion on the remaining bits. This function can suppress variations of the reference voltage in a state in which accurate conversion is required. As a result, far more accurate conversion can be performed.

In the above description, a solid imaging device such as a CMOS image sensor is taken as an example. However, the present invention is not only effective for a solid imaging device, but is also effective for and can be applied to a two-dimensional sensor device for another purpose, a one-dimensional sensor device, or a single sensor device. The sensor is not limited to an image sensor, and the present invention is effective also for a temperature sensor, a position sensor, a torque sensor, a speed sensor, an acceleration sensor, a pressure sensor, and so forth.

Furthermore, the sensor and the A/D conversion circuit are not only monolithically integrated on an integrated circuit but may be individually manufactured and jointed by packaging technology or the like.

The A/D converter of the present embodiment is not only combined with a sensor but also, needless to say, can be applied to various devices which convert a received analog signal to a digital signal.

INDUSTRIAL APPLICABILITY

The present invention can be used for achieving high sensitivity, high accuracy, and low power of a sensor device, allows a design so as to prevent stationary current from flowing, and can vary the operation frequency in a range of several digits. In addition, with easy intermittent operation, the present invention is useful for, in particular, a sensor device for IoT (Internet Of Things).

What is claimed is:

1. An A/D converter comprising:
    an analog input terminal;
    a successive approximation A/D converter connected to the analog input terminal, the successive approximation A/D converter for generating an upper conversion result at an upper conversion result terminal, the successive approximation A/D converter having an internal D/A converter generating an internal reference voltage at an internal reference voltage terminal; and
    a delta-sigma A/D converter connected to the analog input terminal and the internal reference voltage terminal, the delta-sigma A/D converter for generating a lower conversion result at a lower conversion result terminal, the delta-sigma A/D converter having an integrator,
    wherein the integrator comprises:
        a first switch, one terminal of which is connected to an integrator input terminal;
        a first capacitor connected between a reference voltage terminal and another terminal of the first switch;
        a second switch connected between an integrator output terminal and the other terminal of the first switch;
        a second capacitor connected between the reference voltage terminal and the integrator output terminal;
        an amplifier having an input connected to the integrator output terminal and an output, the amplifier amplifying a voltage at the integrator output terminal;
        a third switch one terminal of which is connected to the output of the amplifier;
        a fourth switch connected between the integrator output terminal and another terminal of the third switch;
        a third capacitor connected between the reference voltage terminal and the other terminal of the third switch; and
        a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

2. The A/D converter according to claim 1, wherein the amplifier is a dynamic type amplifier.

3. The A/D converter according to claim 2, wherein the amplifier comprises:
    first and second output capacitors;
    a pre-charge circuit connected to the first and the second output capacitors, the pre-charge circuit pre-charging the first and the second output capacitors; and
    a discharge circuit connected to the first and the second output capacitors, the discharge circuit selectively discharging one of the first and the second output capacitors in response to a voltage applied to the input of the amplifier.

4. The A/D converter according to claim 1 further comprising a circuit for controlling either one of (a) a usage of the delta-sigma A/D converter, (b) an oversampling ratio of the delta-sigma A/D converter, (c) a quantization voltage of the delta-sigma A/D converter, or (d) a conversion energy of the delta-sigma A/D converter.

5. The A/D converter according to claim 4, wherein a noise $V_{n\_ad}$ of the A/D converter is smaller than a shot noise $V_{n\_sh}$ of the sensor.

6. The A/D converter according to claim 4 further comprising a data storage for storing a value corresponding to (a) the usage of the delta-sigma A/D converter or (b) the oversampling ratio of the delta-sigma A/D converter, (c) the quantization voltage of the delta-sigma A/D converter, or (d) the conversion energy of the delta-sigma A/D converter.

7. The A/D converter according to claim 1 further comprising a controller for rendering the successive approximation A/D converter and the delta-sigma A/D converter to alternately convert a reference signal and a signal from a signal source, wherein the controller controls the internal D/A converter to be supply with a conversion result of a past reference signal for generating the internal reference voltage.

8. The A/D converter according to claim 1 further comprising a controller for rendering the successive approximation A/D converter and the delta-sigma A/D converter to alternately convert a reference signal and a signal from a signal source, wherein the controller controls the internal D/A converter to be supply with a conversion result of a past signal from the signal source for generating the internal reference voltage.

9. The A/D converter according to claim 8, wherein when the conversion result of the past signal from the signal source is smaller than a reference value the controller controls the internal D/A converter to be supply a conversion result of a past reference signal for generating the internal reference voltage.

10. An A/D converter comprising:
    an analog input terminal;
    a differential amplifier having a pair of input signal ends and a pair of output signal ends, the differential amplifier for generating a differential voltage by amplifying a differential input voltage of the pair of input signal ends at the pair of output signal ends;
    a sampling capacitor connected between the analog input terminal and one of the input signal end;
    capacitive D/A converters connected to the other input signal end, the capacitive D/A converters for generating an internal reference voltage corresponding to the input value at the other input end, the capacitive D/A converters for performing a successive approximation A/D conversion;
    a pair of switches, the pair of switches for clamping a voltage of the pair of input signal ends to a predetermined voltage; and
    a pair of capacitors connected to the pair of input signal ends, the pair of capacitors for performing a delta-sigma A/D conversion.

11. The A/D converter according to claim 10, further comprising:
    a pair of capacitors, one terminal of which is connected to the pair of output signal ends;
    a comparator connected to another terminal of the pair of capacitors, the comparator for performing the successive approximation A/D conversion;
    an integrator connected to the another terminal of the pair of capacitors, the integrator for performing the delta-sigma A/D conversion; and
    a pair of switches, the pair of switches for clamping a input voltage of the comparator and the integrator to a predetermined voltage.

12. The A/D converter according to claim 10, wherein the delta-sigma A/D converter has an integrator, the integrator comprising:
    a first switch, one terminal of which is connected to an integrator input terminal;
    a first capacitor connected between a reference voltage terminal and another terminal of the first switch;

a second switch connected between an integrator output terminal and the other terminal of the first switch;

a second capacitor connected between the reference voltage terminal and the integrator output terminal;

an amplifier having an input connected to the integrator output terminal and an output, the amplifier amplifying a voltage at the integrator output terminal;

a third switch one terminal of which is connected to the output of the amplifier;

fourth switch connected between the integrator output terminal and another terminal of the third switch;

a third capacitor connected between the reference voltage terminal and the other terminal of the third switch; and a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

13. The A/D converter according to claim 12, wherein the amplifier is a dynamic type amplifier.

14. The A/D converter according to claim 13, wherein the amplifier comprises:
first and second output capacitors;
a pre-charge circuit connected to the first and the second output capacitors, the pre-charge circuit pre-charging the first and the second output capacitors; and
a discharge circuit connected to the first and the second output capacitors, the discharge circuit selectively discharging one of the first and the second output capacitors in response to a voltage applied to the input of the amplifier.

15. The A/D converter according to claim 10 further comprising a circuit for controlling either one of (a) a usage of the delta-sigma A/D converter, (b) an oversampling ratio of the delta-sigma A/D converter, (c) a quantization voltage of the delta-sigma A/D converter, or (d) a conversion energy of the delta-sigma A/D converter.

16. The A/D converter according to claim 15, wherein a noise $V_{n\_ad}$ of the A/D converter is smaller than a shot noise $V_{n\_sh}$ of the sensor.

17. The A/D converter according to claim 15 further comprising a data storage for storing a value corresponding to (a) the usage of the delta-sigma A/D converter, (b) the oversampling ratio of the delta-sigma A/D converter, (c) the quantization voltage of the delta-sigma A/D converter, or (d) the conversion energy of the delta-sigma A/D converter.

18. The A/D converter according to claim 10 further comprising a controller for rendering the successive approximation A/D converter and the delta-sigma A/D converter to alternately convert a reference signal and a signal from a signal source, wherein the controller controls the internal D/A converter to be supply with a conversion result of a past reference signal for generating the internal reference voltage.

19. The A/D converter according to claim 10 further comprising a controller for rendering the successive approximation A/D converter and the delta-sigma A/D converter to alternately convert a reference signal and a signal from a signal source, wherein the controller controls the internal D/A converter to be supply with a conversion result of a past signal from the signal source for generating the internal reference voltage.

20. The A/D converter according to claim 19, wherein when the conversion result of the past signal from the signal source is smaller than a reference value the controller controls the internal D/A converter to be supply a conversion result of a past reference signal for generating the internal reference voltage.

21. A sensor device comprising:
a sensor detecting a signal in the nature and converting the signal into an electric signal, and
an A/D converter using the electric signal as an input voltage, wherein the A/D converter comprising:
an analog input terminal;
a successive approximation A/D converter connected to the analog input terminal, the successive approximation A/D converter for generating an upper conversion result at an upper conversion result terminal, the successive approximation A/D converter having an internal D/A converter generating an internal reference voltage at an internal reference voltage terminal; and
a delta-sigma A/D converter connected to the analog input terminal and the internal reference voltage terminal, the delta-sigma A/D converter for generating a lower conversion result at a lower conversion result terminal, the delta-sigma A/D converter having an integrator,
wherein the integrator comprises:
a first switch, one terminal of which is connected to an integrator input terminal;
a first capacitor connected between a reference voltage terminal and another terminal of the first switch;
a second switch connected between an integrator output terminal and the other terminal of the first switch;
a second capacitor connected between the reference voltage terminal and the integrator output terminal;
an amplifier having an input connected to the integrator output terminal and an output, the amplifier amplifying a voltage at the integrator output terminal;
a third switch one terminal of which is connected to the output of the amplifier;
a fourth switch connected between the integrator output terminal and another terminal of the third switch;
a third capacitor connected between the reference voltage terminal and the other terminal of the third switch; and
a control circuit repeating a first phase and a second phase, the control circuit rendering, in the first phase, the first switch and the third switch to turn on and the second switch and the fourth switch to turn off, and in the second phase, the second switch and the fourth switch to turn on and the first switch and the third switch to turn off.

22. The sensor device according to claim 21, wherein the sensor comprises a plurality of unit sensors and an operation circuit for selecting the unit sensor.

23. The sensor device according to claim 22, wherein the sensor further comprises a signal source for detecting the signal in the nature, a reference signal source for supplying a reference signal, and a transistor for transferring these signals to a holding capacitor.

24. A sensor device comprising:
a sensor detecting a signal in the nature and converting the signal into an electric signal, and
an A/D converter using the electric signal as an input voltage, wherein the A/D converter comprising:
an analog input terminal;
a differential amplifier having a pair of input signal ends and a pair of output signal ends, the differential amplifier for generating a differential voltage by amplifying a differential input voltage of the pair of input signal ends at the pair of output signal ends;

a sampling capacitor connected between the analog input terminal and one of the input signal end;

capacitive D/A converters connected to the other input signal end, the capacitive D/A converters for generating an internal reference voltage corresponding to the input value at the other input end, the capacitive D/A converters for performing a successive approximation A/D conversion;

a pair of switches, the pair of switches for clamping a voltage of the pair of input signal ends to a predetermined voltage; and a pair of capacitors connected to the pair of input signal ends, the pair of capacitors for performing a delta-sigma A/D conversion.

25. The sensor device according to claim 24, wherein the sensor comprises a plurality of unit sensors and an operation circuit for selecting the unit sensor.

26. The sensor device according to claim 25, wherein the sensor further comprises a signal source for detecting the signal in the nature, a reference signal source for supplying a reference signal, and a transistor for transferring these signals to a holding capacitor.

* * * * *